United States Patent
Moulton et al.

(10) Patent No.: US 8,223,067 B2
(45) Date of Patent: Jul. 17, 2012

(54) NOISE-CANCELING DOWN-CONVERTING DETECTOR

(75) Inventors: Grant E. Moulton, Santa Rosa, CA (US); Christopher E. Stewart, Sebastopol, CA (US); Steven H. Goody, Santa Rosa, CA (US)

(73) Assignee: Invention Planet, LLC, Santa Rosa, CA (US)

( * ) Notice: Subject to any disclaimer, the term of this patent is extended or adjusted under 35 U.S.C. 154(b) by 439 days.

(21) Appl. No.: 12/590,145

(22) Filed: Nov. 2, 2009

(65) Prior Publication Data

US 2011/0102246 A1 May 5, 2011

(51) Int. Cl.
*G01S 13/00* (2006.01)

(52) U.S. Cl. .............. 342/159; 342/89; 342/92

(58) Field of Classification Search ........... 342/159–164
See application file for complete search history.

(56) References Cited

U.S. PATENT DOCUMENTS

| | | | | |
|---|---|---|---|---|
| 3,942,178 A | * | 3/1976 | Hackett | 342/28 |
| 4,115,774 A | * | 9/1978 | Tresselt | 342/174 |
| 4,176,351 A | * | 11/1979 | DeVita et al. | 342/111 |
| 4,254,505 A | * | 3/1981 | Bossert | 455/146 |
| 4,323,898 A | * | 4/1982 | Barnes et al. | 342/90 |
| 4,649,388 A | * | 3/1987 | Atlas | 342/26 D |
| 4,856,084 A | * | 8/1989 | Richards, Jr. | 455/223 |
| 4,888,557 A | * | 12/1989 | Puckette et al. | 329/341 |
| 4,896,374 A | * | 1/1990 | Waugh et al. | 455/326 |
| 4,926,443 A | * | 5/1990 | Reich | 375/349 |
| 5,262,783 A | | 11/1993 | Philpott et al. | |
| 5,423,080 A | | 6/1995 | Perret et al. | |
| 5,570,094 A | | 10/1996 | Armstrong | |
| 5,596,325 A | * | 1/1997 | Maas | 342/28 |
| 5,806,804 A | * | 9/1998 | Goodzeit et al. | 244/169 |
| 5,861,837 A | * | 1/1999 | Richardson et al. | 342/198 |
| 5,864,061 A | | 1/1999 | Dilz, Jr. | |
| 5,940,025 A | * | 8/1999 | Koehnke et al. | 342/159 |
| 6,091,355 A | | 7/2000 | Cadotte, Jr. et al. | |
| 6,121,919 A | * | 9/2000 | Ameen et al. | 342/174 |
| 6,134,281 A | * | 10/2000 | Green et al. | 375/347 |
| 6,809,681 B1 | * | 10/2004 | Niechayev | 342/159 |
| 7,079,400 B2 | * | 7/2006 | Inamoto et al. | 361/778 |
| 7,099,642 B2 | * | 8/2006 | Fernandez-Corbaton et al. | 455/255 |

(Continued)

FOREIGN PATENT DOCUMENTS

EP 0098339 A1 1/1984

(Continued)

OTHER PUBLICATIONS

ISR and Written Opinion for PCT/US2010/055019 (corr. to U.S. Appl. No. 12/590,145).

(Continued)

*Primary Examiner* — Thomas Tarcza
*Assistant Examiner* — Peter Bythrow

(57) ABSTRACT

A detector system has a first detector configured to detect a first high-frequency signal having amplitude-modulated ("AM") noise to produce a first detected signal having at least a first detected AM noise signal component and a demodulated signal component and a second detector configured to detect a second high-frequency signal having the AM noise to produce a second detected signal having at least a second detected AM noise signal component. An algebraic combining network combines the first detected signal and the second detected signal to cancel the first detected AM noise signal component with the second detected AM noise signal component to produce an output signal including the demodulated signal component.

20 Claims, 11 Drawing Sheets

U.S. PATENT DOCUMENTS

| | | | |
|---|---|---|---|
| 7,436,356 B2 * | 10/2008 | Bochkovskiy et al. | 342/357.68 |
| 8,085,185 B2 * | 12/2011 | Stewart et al. | 342/92 |
| 8,089,394 B2 * | 1/2012 | Stewart et al. | 342/104 |
| 2002/0102958 A1 * | 8/2002 | Buer | 455/296 |
| 2004/0257268 A1 * | 12/2004 | Aker et al. | 342/114 |
| 2006/0181449 A1 * | 8/2006 | Aker | 342/104 |
| 2007/0296625 A1 * | 12/2007 | Bruzzone et al. | 342/13 |
| 2008/0106460 A1 * | 5/2008 | Kurtz et al. | 342/99 |
| 2011/0102240 A1 * | 5/2011 | Stewart et al. | 342/92 |
| 2011/0102241 A1 * | 5/2011 | Stewart et al. | 342/104 |
| 2011/0102246 A1 * | 5/2011 | Moulton et al. | 342/159 |

FOREIGN PATENT DOCUMENTS

| | | | |
|---|---|---|---|
| JP | 53005590 A | 1/1978 | |
| JP | 4184184 A | 7/1992 | |
| JP | 2000-028702 A | 1/2000 | |
| JP | 2004-247831 A | 9/2004 | |
| KR | 10-2005-0056932 A | 6/2005 | |
| WO | WO 96-07931 A1 | 3/1996 | |
| WO | WO 01-26215 A2 | 4/2001 | |

OTHER PUBLICATIONS

ISR and Written Opinion for PCT/US2010/0055013 (corr. to U.S. Appl. No. 12/590,117).

ISR and Written Opinion for PCT/US2010/ 0055017 (corr. to U.S. Appl. No. 12/590,116).

Machine English Translation for JP-4184184-A.

Machine English Translation for JP-53005590 A.

Results of Search for Prior Art, Dr. Arito Nishimori, Ph.D., Aug. 16, 2011 (for corresponding PCT/US/055019).

* cited by examiner

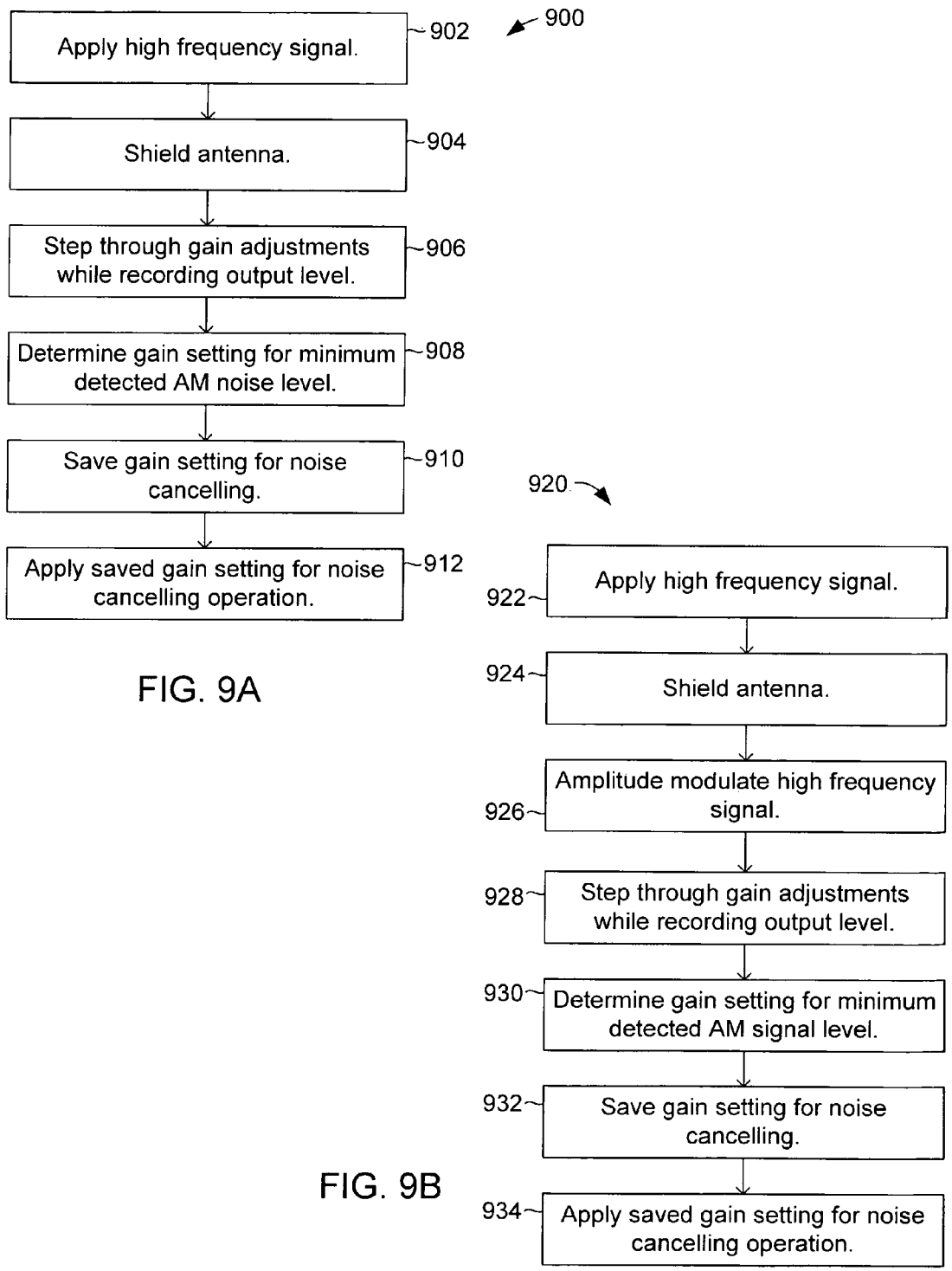

NOISE-CANCELING DOWN-CONVERTING DETECTOR

CROSS-REFERENCE TO RELATED APPLICATIONS

This patent application is being concurrently filed with commonly owned utility U.S. patent application Ser. No. 12/590,117, entitled "Method of Down Converting High-frequency Signals", by Christopher E. Stewart, Grant E. Moulton, and Steven H. Goody; and with commonly owned utility U.S. patent application Ser. No. 12/590,116, entitled "Continuous-Wave Field Disturbance Sensing System", by Christopher E. Stewart, Grant E. Moulton, and Steven H. Goody; and with commonly owned design U.S. patent application Ser. No. 29/316,807, entitled "Hand-Held Radar Device", by Steven H. Goody, Joie L. Puckett, Jr., Grant E. Moulton, Christopher E. Stewart.

STATEMENT REGARDING FEDERALLY SPONSORED RESEARCH

None.

NAMES OF PARTIES TO A JOINT RESEARCH AGREEMENT

None.

REFERENCE TO A SEQUENCE LISTING

None.

FIELD OF THE INVENTION

This invention relates generally to electromagnetic field disturbance sensing techniques, such as radar systems.

BACKGROUND OF THE INVENTION

Continuous Wave (CW) Coherent Radar uses frequency conversion to compare the phase of a transmitted signal with the reflection of that signal from a moving target. The phase of the wave reflected from the target changes as a function of the changing distance to that target. If the target velocity remains constant, the phase of the reflected signal changes at a constant rate. A constant rate of phase change corresponds to a constant frequency. Thus the returning reflected signal appears at a frequency offset from the transmitted signal that is proportional to the relative velocity between the transmitter and the target.

Comparing the transmitted signal and the received signal with a frequency downconverter delivers the difference frequency between the transmitted and received signals at the converter output. Practical implementation of a radar seeks to optimize the cost and size of the equipment required to compare the phase (or frequency) of the transmitted and received signals, while obtaining the greatest detection range to target possible for that cost and size.

Many conventional portable radar guns use a Gunn diode driving a cavity oscillator with an integral diode peak detector which functions as a frequency downconverter or mixer, using either one or multiple detector diodes. The cavity oscillator/mixer is coupled to a horn antenna used to transmit the incident signal and to receive the reflected signal. The cavity drives the diode detector with a local oscillator ("LO") signal from the transmitter and couples the received RF signal to the same diode. The diode detector mixes the RF and LO signals, creating an IF signal at their difference frequency. The diode detector typically matches to a relatively high impedance, often hundreds or even thousands of ohms, and conversion loss can approach 0 dB. Matching to LO and RF signals is accomplished by moving the diode location within the cavity to optimize the coupling for optimal system performance.

The detector diode also rectifies the LO power in the cavity, and any variations in the amplitude due to either coherent amplitude modulation ("AM") or to AM noise will show up at the IF output. Because of this problem, designers typically use Gunn diode oscillators adjusted to the point of minimal conversion of diode bias supply voltage input to amplitude variation. This minimizes the AM noise on the LO and thus also minimizes the detected LO AM noise on the IF output allowing for sufficiently sensitive RF detection.

The cavity based radar devices typically require a horn antenna up to several inches long and a cavity oscillator at least one or more cubic inches in size for operation at the 10 GHz or 24 GHz ISM bands (e.g., the X, and K bands). Both of these factors cause the system to have significant, weight and size, which is undesirable for a small hand-held application. Furthermore, the optimum Gunn diode bias point often requires substantial current draw, limiting the useful operating time for portable, battery-powered applications. Alternatively, the radar size must increase to accommodate larger batteries.

Another design approach to small sized radar devices uses planar or "patch" antenna arrays. These devices either use cavity stabilized Gunn oscillator/detectors or use traditional switching mixers where the LO signal switches the RF signal phase to the IF output dependent upon LO phase. The switching type of mixer typically shows 6 dB or more conversion loss, and must be a balanced configuration to cancel any AM noise of the local oscillator. Diodes used in conventional mixer-based systems act like switches that provide either an open circuit or a closed switch in a signal path. The LO signal drives the mixer diode(s) to turn the diode "on", or low impedance, for about a half cycle and "off", or high impedance, for the other half cycle.

The balanced or double or triple balanced switching diode mixer suffers from imperfect AM noise cancelation due to variations in manufacturing and remains sensitive to the AM noise of most oscillators. The down-converted local oscillator AM noise obscures the incoming RF signal, even while the local oscillator phase noise cancels due to the short time required for the round trip on the radar path or the path inside the mixer itself. Conventional (incoherent) receivers do not typically see the AM noise of the LO as the phase noise typically dominates the AM noise by tens of dB. Only in coherent reception (such as used for CW radar) does the phase noise of the LO cancel and allow the AM noise to dominate.

Additionally, the IF output of a switching diode mixer typically requires termination with a low noise IF amplifier with low input impedance, usually equal to 50 ohms. The noise voltage of that amplifier with 6 dB mixer loss is equivalent to twice that noise voltage measured at the antenna input. Diodes typically add another 0.5 to 1 dB to the input noise of the mixer above the conversion loss, further degrading the receive signal to noise ratio as seen at the antenna RF port. This type of radar does not typically deliver good long range performance compared with the Gunn and horn antenna alternatives without the addition of other components such as additional antennas or an RF preamplifier.

Other devices constructed using planar patch antenna arrays have used a Gunn-based cavity oscillator for the transmitter source and a detector diode for the receive mixer. These can provide reasonable AM noise from the Gunn source, but are limited in miniaturization by the size of the oscillator resonant cavity.

Components for radar systems and other applications overcoming the deficiencies of the prior art are desirable.

SUMMARY OF THE INVENTION

A detector system has a first detector configured to detect a first high-frequency signal having amplitude-modulated ("AM") noise to produce a first detected signal having at least a first detected AM noise signal component and a demodulated signal component and a second detector configured to detect a second high-frequency signal having the AM noise to produce a second detected signal having at least a second detected AM noise signal component. An algebraic combining network combines the first detected signal and the second detected signal to cancel the first detected AM noise signal component with the second detected AM noise signal component to produce an output signal including the demodulated signal component.

In a further embodiment, the first high-frequency signal includes a local high-frequency signal and a received high-frequency signal, the demodulated signal component being at a difference frequency between the local high-frequency signal and the received high-frequency signal. In a particular embodiment, the second high-frequency signal is the local high-frequency signal. In an alternative embodiment, the second high-frequency signal includes the local high-frequency signal and the received high-frequency signal, and the second detected signal further includes a second demodulated signal component at the difference frequency. The output signal of the algebraic combining network can include the second demodulated signal component added to the demodulated signal component.

In some embodiments, the received high-frequency signal is a reflected signal of the local high-frequency signal.

A further embodiment includes a high-frequency algebraic combining network combining the local high-frequency signal and the received high-frequency signal and provides the local high-frequency signal and the received high-frequency signal to the first detector.

In a particular embodiment, the algebraic combining network has an inverting input and a non-inverting input, the first detected signal is provided to the non-inverting input and the second detected signal is provided to the inverting input.

In a particular embodiment, the first high-frequency signal includes a local high-frequency signal and a received high-frequency signal, the output signal being at a difference frequency.

In some embodiments, a detector system includes a high-frequency algebraic combining network configured to receive a local high-frequency signal and a received high-frequency signal. The high-frequency algebraic combining network provides the local high-frequency signal and the received high-frequency signal to the first detector, and provides the local high-frequency signal and an inverse of the received high-frequency signal to the second detector. The second detector produces the second detected signal having the second detected AM noise signal component and an inverse demodulated signal component.

In some embodiments, the algebraic combining network has an inverting input and a non-inverting input. The first detected signal is provided to the non-inverting input and the second detected signal is provided to the inverting input to produce an inverse AM noise signal component and a second demodulated signal component. The output signal is a sum of the demodulated signal component and the second demodulated signal component, and the inverse AM noise signal component cancels the AM noise signal component.

The detectors can be a single-diode detector, a dual-diode detector, a diode voltage multiplier, for example.

In a particular embodiment, the high-frequency algebraic combining network has a first received signal path through the high-frequency algebraic combining network, a second received signal path through the high-frequency algebraic combining network, a first LO signal path through the high-frequency algebraic combining network, and a second LO signal path through the high-frequency algebraic combining network. A first high-frequency combiner combines a received signal in the first received signal path and an LO signal in the first LO signal path, and provides a first combined signal to the first detector. A second high-frequency combiner combines the received signal in the second RF signal path and the LO signal in the second LO signal path and provides a second combined signal to the second detector. In a particular embodiment, the first combined signal is the LO signal plus the received signal and the second combined signal is the LO signal minus the received signal.

In a particular embodiment, a detector system includes a second algebraic combining network disposed between the first detector and the algebraic combining network. The second algebraic combining network has a first positive output connected to a first non-inverting input of the algebraic combining network, and a first negative output connected to a first inverting input of the algebraic combining network. In a further embodiment, the second detected signal includes a second demodulated signal component, and a third algebraic combining network disposed between the second detector and the algebraic combining network has a second positive output connected to a second inverting input of the algebraic combining network. A second negative output is connected to a second non-inverting input of the algebraic combining network.

In a further embodiment, an adjustable gain stage is between the algebraic combining network and one of the second algebraic combining network and the third algebraic combining network. The adjustable gain stage allows adjustment of one of the detected AM noise signals so that the second detected AM noise signal component is equal to the first detected AM noise signal times a gain factor. For example, the adjustable gain stage divides the second detected AM noise signal component by the gain factor.

BRIEF DESCRIPTION OF THE DRAWINGS

FIG. 9A is a flow chart of a method of calibrating a field disturbance sensing system for noise according to an embodiment.

FIG. 9B is a flow chart of a method of calibrating AM signal gain of a field disturbance sensing system according to an embodiment.

DETAILED DESCRIPTION OF THE DRAWINGS

Figure 1:
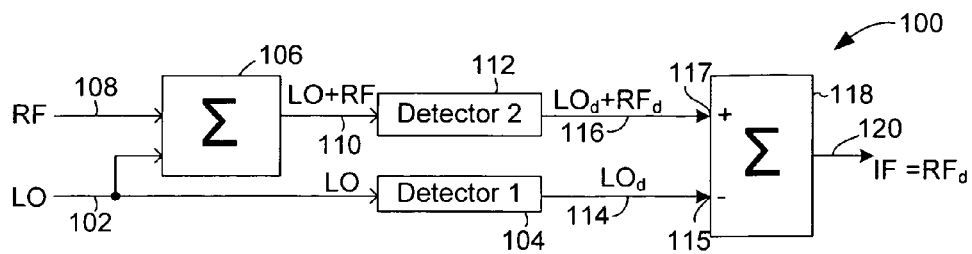
FIG. 1 is a block diagram of a noise canceling down-converting detector according to an embodiment.

Field disturbance sensing systems (e.g., radar systems, motion sensors, automatic door openers, automotive sensors, and low-IF Tx/Rx systems) according to embodiments achieve small size and improved range, sensitivity and signal-to-noise ratio. Systems according to some embodiments are mobile, battery-powered systems. Other embodiments are fixed installations with AC (mains) power or external power supplies. A noise-canceling down-converting detector according to an embodiment cancels the AM noise from a first signal (signal 1, which will be referred to as an "LO signal", although it performs quite differently from an LO signal in a switching mixer system) or transmitter signal.

Some embodiments of detectors provide significant conversion gain when properly matched to the detector circuit compared to a conventional switching mixer-based system. In some embodiments, greater than 10 dB of conversion voltage gain has been measured. Improved conversion gain allows use of a simple, low cost IF amplifier as an alternative to the more expensive low noise IF or RF amplifiers used in conventional switched diode mixer systems because of the superior signal to noise ratio embodiments achieve. In some embodiments, low noise IF amplifiers are used to boost the converted signal with minimal additional noise. As used herein, "noise canceling" means AM noise detected at one detector is subtracted from essentially the same AM noise detected at another detector.

A noise canceling down-converting detector according to an embodiment detects an incoming (reflected or other RF) signal while canceling AM noise on the local (transmitted or LO) signal. The noise canceling down-converting detector does not operate as a traditional switching mixer in that it does not switch or gate the RF signal to an IF port with the LO signal controlling the switching action. Instead, the noise canceling down-converting detector operates as two or more separate envelope detectors.

The detectors detect the instantaneous value (voltage) of two high-frequency signals. One of these signals includes the average (steady state) LO power (generating an essentially DC detected output), the instantaneous RF power, which adds to or subtracts from the LO signal to produce a beat (IF) signal, and the instantaneous LO AM noise power, which can also add to or subtract from the average LO power, thus introducing inaccuracy into the peak detected voltage (potentially obscuring or adding uncertainty to the detected RF signal). The signal-of-interest (e.g., the reflected signal or a received signal from a transmitter) is demodulated into a component of the detected signal ("demodulated component").

The other signal includes at least the average LO power and the instantaneous LO AM noise power (and optionally the RF signal or other signals). The detected steady-state LO signals are DC, and are rejected or otherwise canceled (e.g., do not affect an RC detector load). The detected AM noise components are subtracted from each other, thus canceling the effect of LO AM noise on the resultant detected (IF) signal. The RF signal, which in some embodiments is the reflected signal from a moving object, adds to or subtracts from the instantaneous LO signal at the detector and increases or decreases the peak voltage, and hence the detector output. A convenient visualization is that the reflected signal is "sliding past" the LO signal, and the detector produces an IF signal at a beat frequency in base band.

In conventional switching mixers, the IF signal is the sum or difference between two frequencies (i.e., the RF and LO signals). In other words, a conventional switching mixer can operate as an upconverter or a downconverter. Conventional switching mixers typically operate in a relatively low impedance system (e.g., a system with a characteristic impedance of fifty ohms) at all mixer ports; LO, RF and IF. Noise canceling down-converting detectors are not limited to systems with such low impedance at the IF port.

FIG. 1 is a block diagram of a noise canceling down-converting detector ("NCDD") system 100 according to an embodiment. A high-frequency signal ("LO signal") 102 is provided to a first detector 104 and to an algebraic combining network 106 that combines the high-frequency signal 102 with the RF signal 108 to produce an RF+LO signal 110, which is provided to a second detector 112. In some applications, such as CW radar, the high-frequency signal is a transmitted signal and RF signal is a reflected signal, namely the reflected LO from a target (see, e.g. FIG. 7B). In other applications, the RF signal is a high-frequency signal that is generated by a transmitter device, or a re-generated LO signal. While many applications of embodiments use a coherent RF signal, other applications do not.

In a continuous-wave ("CW") radar system, a high-frequency (LO) signal is sent to an antenna and transmitted to a target, which reflects a portion of the energy (the "reflected" or "RF" signal) that is received by the same antenna or by a second antenna. Relative motion between the target and antenna(s) is detected as a frequency shift between the reflected signal and the transmitted (LO) signal. The detected frequency shift is processed to determine the speed of the relative motion. The LO signal is typically much higher power than the reflected signal, and AM noise on the LO signal can obscure the RF component.

The outputs 114, 116 from the detectors 104, 112 are provided to a non-inverting input 117 and an inverting input 115 of a second algebraic combining network 118 to produce a detected output signal 120, which will be referred to as an intermediate frequency ("IF") signal for purposes of convenient discussion. The second algebraic combining network 118 can be implemented in any of several types of circuits, such as an operational amplifier, differential amplifier, or a digital circuit technique incorporating analog-to-digital converters and subsequent digital signal processing in hardware or software. The second algebraic combining network combines the first detected signal and the second detected signal to cancel the detected AM noise. The first detected signal 116 includes a detected AM noise component ($LO_d$) and a second detected signal component ($RF_d$). The second detected signal 114 includes a detected AM noise component ($LO_d$) nominally equal to the detected AM noise component in the first detected signal 116, thus, the detected AM noise cancels. The output signal (IF) 120 is the second detected signal component ($RF_d$).

The IF signal of FIG. 1 is basically the demodulated RF signal, which is essentially a beat note as the phase of the RF signal advances or retreats in relation to the CW LO signal. In the case of a CW radar system, the phase of the RF signal advances or retreats relative to the phase of the LO signal according to the speed of an object reflecting the RF signal back to the system as the object moves toward or away from the LO source and the path length to and from the object decreases or increases. The period of the beat note indicates the speed of the object. In an ideal system, the detected LO signal amplitude (DC component of the detected LO signal) is the same at both detectors 112, 104 and cancels out at the inputs 115, 117 of the algebraic combining network 118. Alternatively, the DC components are not equal, but are blocked (e.g., capacitively), rejected, or otherwise do not affect the beat frequency between the RF and LO signals.

The IF signal 120 equals the detected LO signal at input 117, minus the detected LO signal at input 115, plus the detected RF signal at input 117. The system is setup (e.g., matched design or calibrated) such that the output signals at 114 and 116 are equal in amplitude and phase for a given incident power at the LO port 102, thus canceling the LO AM noise on the signal output. In some systems, the amplitude of the LO signal is much higher than the RF signal and the LO AM noise can dominate the differences in the peak signal voltage arising from the RF signal. The system 100 avoids the problem of LO AM noise dominating the RF signal by subtracting the detected LO signal and associated LO AM noise from a detected copy of that same signal.

In a particular embodiment, the first and second detectors are single diode detectors. In alternative embodiments, the first and second detectors are multiple diode detectors or other types of detectors. In a particular embodiment the first and second detectors are substantially identical to each other so that the detected LO signals are substantially identical and provide good cancelation of the LO AM noise. Manufacturing tolerances can result in minor differences, and some embodiments include calibration techniques, as discussed below in reference to FIG. 3B. In alternative embodiments, the detectors are not identical, but are balanced. In other words, each detector produces substantially identical output signals from the same input signal(s). Many variations in components and circuits are used in alternative embodiments, as designing substantially identical circuits and using substantially identical (i.e., the same part number, and in some cases, matched parts) is only one of many ways to achieve the desired signal balance.

Figure 2A:
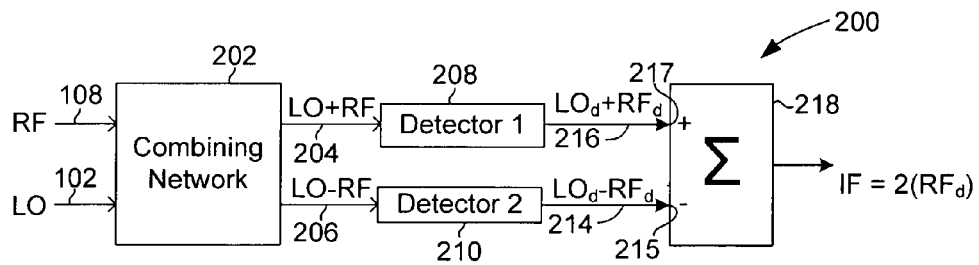
FIG. 2A is a block diagram of a noise canceling down-converting detector according to another embodiment.

FIG. 2A is a block diagram of a noise canceling down converting detector 200 according to another embodiment. The RF signal 108 and LO signal 102 are both provided to a algebraic combining network 202 that produces a first high frequency output 204 of LO+RF, and a second high frequency output 206 of LO−RF. A first detector 208 detects the LO+RF signal and the detected signal 216 (LOd+RFd) is provided to the non-inverting input 217 of another algebraic combining network 218. The detected signal 214 (LOd−RFd) from a second detector 210 is provided to the inverting input 215 of the algebraic combining network 218. The output of the algebraic combining network 218 is the IF signal, which is equal to the detected LO signal from 217, minus the detected LO signal from 215, plus the sum of the magnitudes of detected RF signals seen at 215 and 217. When the detected LO and RF signals are optimally combined, the detected LO signal (including the detected LO AM noise) cancels, and the detected RF signal doubles. This provides an IF signal with improved signal-to-noise ratio. In practice, differences arising from manufacturing tolerances and from electrical components (e.g., detector diodes) result in slight imbalances that lead to residual LO AM noise and less than RF power doubling; however, significant performance improvement (voltage gain) of the conversion process is obtained.

Figure 2B:
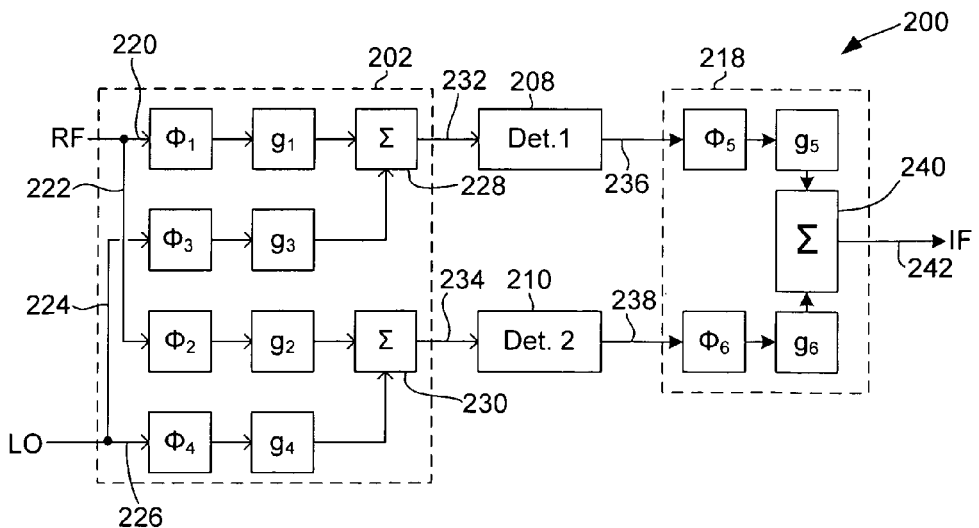
FIG. 2B is a block diagram of the noise canceling down-converting detector of FIG. 2A showing additional details of the high-frequency combining network and the detected signal algebraic combining network.

FIG. 2B is a block diagram of the noise canceling down converting detector 200 of FIG. 2A showing additional details of the high-frequency combining network 202 and the detected signal algebraic combining network 218. In a particular embodiment, the high-frequency combining network 202 includes a ring coupler (see, e.g., FIG. 6A). In alternative embodiments, the high-frequency combining network 202 uses other techniques such as, hybrids, baluns or transformers, or other combining techniques known to one skilled in the art of high-frequency circuit design.

The RF signal path ("first RF path") 220 to the first detector 208 has a first associated phase delay $\Phi 1$ and a first gain (or loss, which will be expressed as negative gain (or −dB) for purposes of discussion) g1, and the RF signal path ("second RF path") 222 to the second detector 210 has a second associated phase delay $\Phi 2$ and second gain g2. The LO signal path ("first LO path") 224 to the first detector 208 has an associated phase shift $\Phi 3$ and gain g3, and the LO signal path ("second LO path") 226 to the second, detector 210 has a phase shift $\Phi 4$ and gain g4.

The RF and LO signals are combined in high-frequency combiners 228, 230, and coupled to the detectors 208, 210. The detectors 208, 210 provide low-frequency signals to outputs 236, 238, and to the detected signal algebraic combining network 218. The detected signals are subject to phase delay $\Phi 5$, $\Phi 6$, and gain g5, g6, before being combined in the low-frequency summer 240 that adds the detected signals to produce a combined IF output 242.

Differences in the phase shifts and gains in complementary paths (i.e., the first and second RF paths 220, 222 and the first and second LO paths 224, 226) arising from component variation and manufacturing tolerances in the combining network 202 can result in different high-frequency output signals 232, 234 being supplied to the detectors 208, 210. Furthermore, differences in the detector components can result in different detector outputs 236, 238, even if the combined high-frequency signals are equal. In some embodiments, one or more of the gain values in the high-frequency combining network 202 is adjustable. In a particular embodiment, a gain value of an LO signal path (e.g., g3, g4) is adjustable to balance the detected LO power from each detector 236, 238, which allows nearly complete cancelation of the detected LO AM noise.

Figure 3A:
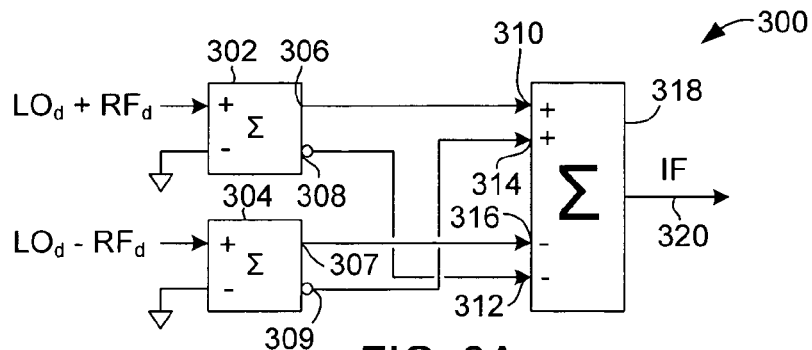
FIG. 3A is a diagram of a portion of noise-canceling system according to an embodiment.

FIG. 3A is a diagram of a noise-canceling system 300 according to an embodiment. The detected signals $LO_d+RF_d$ are provided to algebraic combining network 302, having a positive output 306 and a negative (inverted) output 308. The positive output 306 couples $LO_d+RF_d$ to the first non-inverting input 310 of the low-frequency algebraic combining networks 318 and the negative output 308 couples $-(LO_d+RF_d)$ to a first inverting input 312 of the low-frequency algebraic combining networks 318. Similarly, $LO_d-RF_d$ is coupled to the second non-inverting input 314 and $-(LO_d-RF_d)$ is coupled to the second inverting input 316. The algebraic combining network 304 operates similarly on $LO_d$–$RF_d$ from the second detector.

The added common mode noise at the either differential outputs 306, 308 or differential outputs 307, 309 will cancel at the output 320. Noise may enter the differential output sum from power supply rails or from other inputs. The system 300 cancels the common mode noise; however, it does not cancel differential noise showing up between outputs 306 and 308, or between outputs 307 and 309.

Figure 3B:
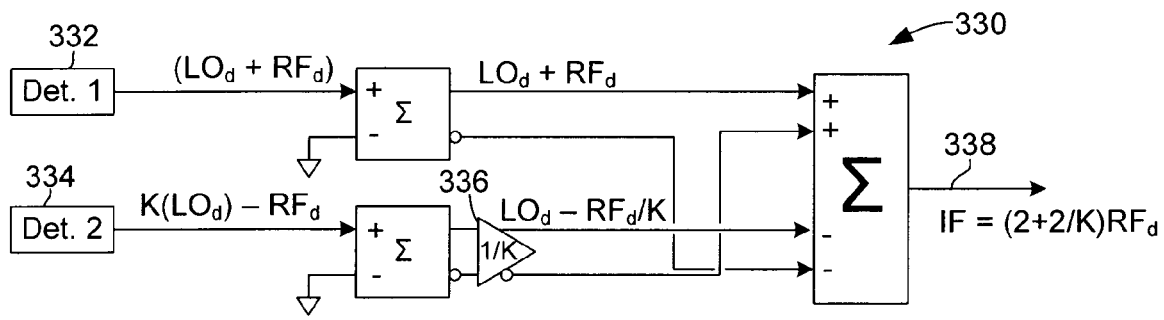
FIG. 3B is a diagram of a portion of a noise-canceling system according to another embodiment.

FIG. 3B is a diagram of a portion of a noise-canceling system 330 according to another embodiment. The output of the detectors 332, 334 have different $LO_d$ levels, which can arise due to different path losses or detector performance, for example. The $RF_d$ levels may also not be equal; however, this is less critical as long as the total detected RF signal is sufficient to provide a valid measurement in a radar or other system because the radar determination of speed only depends upon the reliable detection of the beat frequency and not upon the absolute amplitude of that signal. Different detected LO signals would result in imperfect LO AM noise cancelation because the noise signals would not be equal, which could deliver a higher detected AM noise than the RF signal peak obscuring the accuracy of the RF signal measurement. The output from detector 334 is higher than the output from detector 332 by the scaling (gain) factor K. An adjustable gain stage 336 multiplies the differential outputs by 1/K to drive the two detected LO signals to the same level seen at detector 332, which results in cancellation of the detected LO AM noise by the operation of the algebraic combining network 330:

$$IF=(LO_d+RF_d)+(-(LO_d-(RF_d)/K)-(LO_d-(RF_d)/K)-(-(LO_d+RF_d)) \quad (Eq.\ 1)$$

$$=LO_d-LO_d-LO_d+LO_d+RF_d+(RF_d)/K+(RF_d)/K+RF_d \quad (Eq.\ 2)$$

$$=(2+2/K)RF_d+2LO_d-2LO_d \quad (Eq.\ 3)$$

$$=(2+2/K)RF_d \quad (Eq.\ 4)$$

The gain control 33 allows canceling the LO AM noise, while increasing the detected RF signal by approximately a factor of four (when the two detected LO signals are approximately equal, i.e., when K is close to unity).

In a particular embodiment, a downconverting system is calibrated to achieve cancelation of LO AM signal or noise by adding an amount of AM signal to each LO signal path of the system. By changing the gain K to create identical levels of detected LO AM signals at both detector outputs, the detected AM signal or noise seen at the IF will drop in amplitude. The LO AM canceling is done at baseband (IF/audio), which allows for very precise LO AM calibration/cancelation compared to calibrating at high frequencies (i.e., before detection), where mismatch errors degrade the calibration accuracy. In a particular embodiment, a downconverting system has a built-in calibration source, such as an AM signal or noise source (calibration standard), look-up table ("LUT"), or variable gain or attenuation stage. In a further embodiment, the downconverting system performs an automatic LO AM noise calibration according to firmware instructions (self-calibration). LO AM noise calibration provides improved signal-to-noise performance, which can provide superior range to a radar system.

Figure 4:
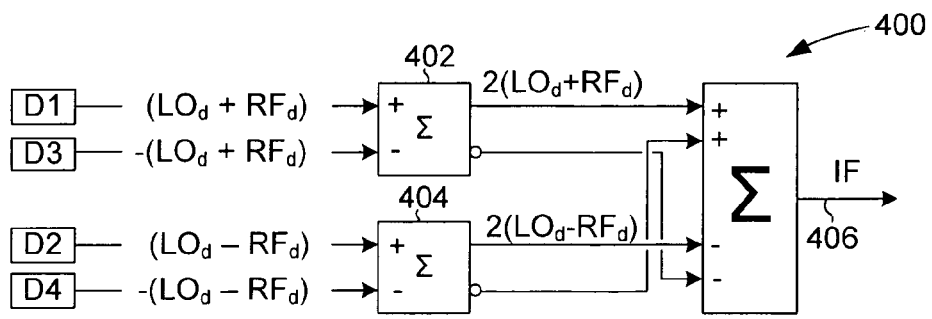
FIG. 4 is a diagram of portion of a noise canceling down-converting detector system according to an embodiment.

FIG. 4 is a diagram of portion of a NCDD system 400 according to an embodiment. The NCDD system 400 is similar to the systems described in reference to FIGS. 3A and 3B, hence a brief description is provided. The system 400 uses four detectors D1, D2, D3, D4 providing four detected signals (as labeled in FIG. 4A) to the differential algebraic combining networks 402, 404. The resultant combined IF output for the case of a difference circuit and equal LO and RF detected signals is:

$$IF=8RF_d+4LO_d-4LO_d=8RF_d \quad (Eq.\ 5)$$

The detectors D1 through D4 may each see as much as half of the incident power to the NCDD, if they are configured as dual diode detectors. They detect peak voltage and add their outputs as voltage. If they are paired as a positive and negative peak detector, their low frequency detected output voltage may nearly double for the same power input. Thus, the four-detector system 400 cancels the detected LO AM noise while increasing the detected RF signal several times over what would be detected by a single-diode system. Uncorrelated diode-generated (i.e., detector generated) noise adds as power. In single diode detector systems, this uncorrelated noise is added to the detected signal and degrades range/sensitivity. In this four-detector system, the four detected RF output signals add as correlated voltages while the four noise outputs add as uncorrelated power, improving the signal to noise ratio and providing low-cost detection systems capable of detecting low or very low RF signals, whether reflected or remotely generated.

Figure 5A:
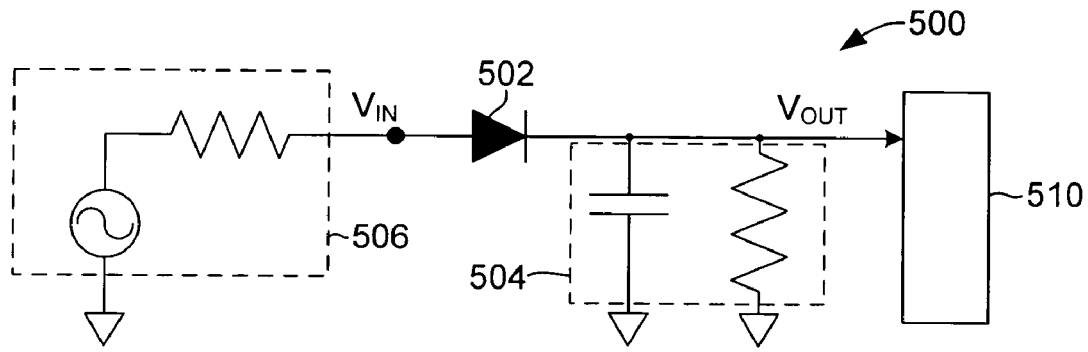
FIG. 5A is a circuit diagram of a single-diode detector used in an embodiment.

FIG. 5A is a circuit diagram of a single-diode detector 500 for use in a downconverting system according to an embodiment (see, e.g., FIG. 1, ref. num. 102). Other detector configurations are alternatively used. A diode 502 is used as a peak detector to develop an output voltage $V_{OUT}$ across a resistive-capacitive ("RC") network 504 according to a high-frequency input voltage $V_{IN}$ from a voltage source 506, and generates a detected output voltage approximately equal to the positive peak input voltage minus the diode forward voltage drop of the detector diode. The input voltage is, for example, the LO+RF voltage (see FIG. 1, ref. num. 110) developed by a local oscillator and an antenna, as described below in reference to FIGS. 6A and 6B. In a particular embodiment, the value of the resistor 508 is selected to maximize detected output voltage without adding excessive resistor noise and the capacitor 510 is selected to provide low pass filtering and energy storage. The detector output connects to the high impedance input of an IF amplifier 510 according to an embodiment. This provides light loading of the detector diode 502, which conducts over a narrow conduction angle of the high-frequency signal, compared to a conventional switching mixer-based system where a mixer diode conducts over a relatively long portion of the high-frequency drive signal.

Switching mixer-based systems require relatively high LO power to drive the mixer diodes. Using a diode as a detector, rather than as a mixer, allows operating the system with lower LO power, which results in lower total system power consumption and wider design choice in LO design. A low LO power requirement at the detector diode also allows splitting the LO power to drive multiple detectors for LO AM noise canceling. Noise-canceling techniques according to embodiments provide downconverting systems with improved signal-to-noise performance over switching mixers or single diode detecting mixers. Using multiple RF detectors can further improve signal-to-noise performance.

Figure 5B:
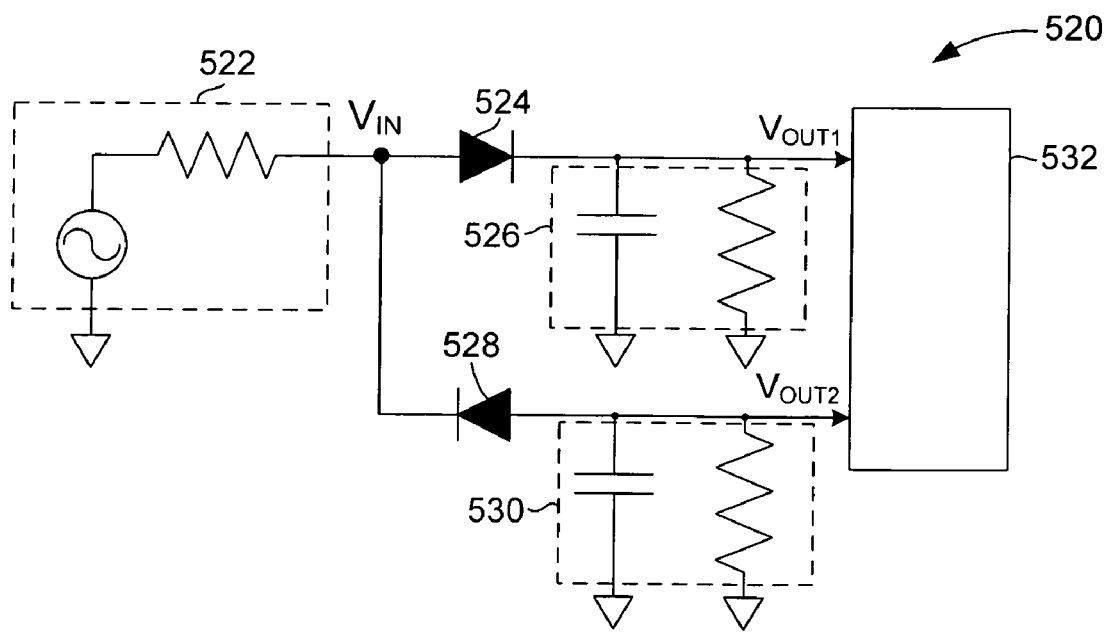
FIG. 5B is a circuit diagram of a dual-diode detector used in an embodiment.

FIG. 5B is a circuit diagram of a dual-diode detector 520 used in an embodiment. A voltage source $V_{IN}$ 522 drives a first diode 524 to produce a first output $V_{OUT1}$ across a first RC network 526 and drives a second diode 528 to produce a second output $V_{OUT2}$ across a second RC network 530. $V_{OUT1}$ is essentially the positive peak voltage of $V_{IN}$ less the diode forward voltage drop, and $V_{OUT2}$ is essentially the negative peak voltage of $V_{IN}$ less the diode forward voltage drop. The detector outputs $V_{OUT1}$, $V_{OUT2}$ are provided to an algebraic combining network 532 according to an embodiment.

Figure 5C:
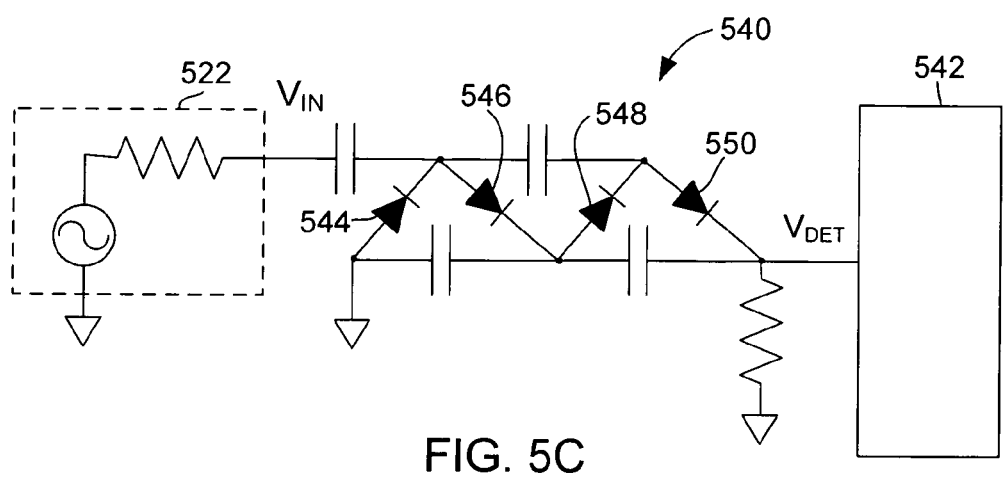
FIG. 5C is a circuit diagram of a diode multiplier circuit used in an embodiment.

FIG. 5C is a diagram of a diode multiplier circuit 540 used in an embodiment. The circuit 540 has four diodes 544, 546, 548, 560 connected so as to provide voltage gain of approximately four over a single diode detector. Each diode is driven by the AC input voltage and will charge up the associated capacitor to which it connects as a peak detector. This detector (voltage multiplier) depends upon a low impedance drive and a high impedance load to deliver voltage gain. The diodes alternate in conduction such that the first and third diode conduct on the negative half cycle and the second and fourth diodes conduct on the positive half cycle of the input signal. The detected output is provided to a high-impedance circuit (e.g., an IF amplifier) 542 according to an embodiment.

Figure 5D:
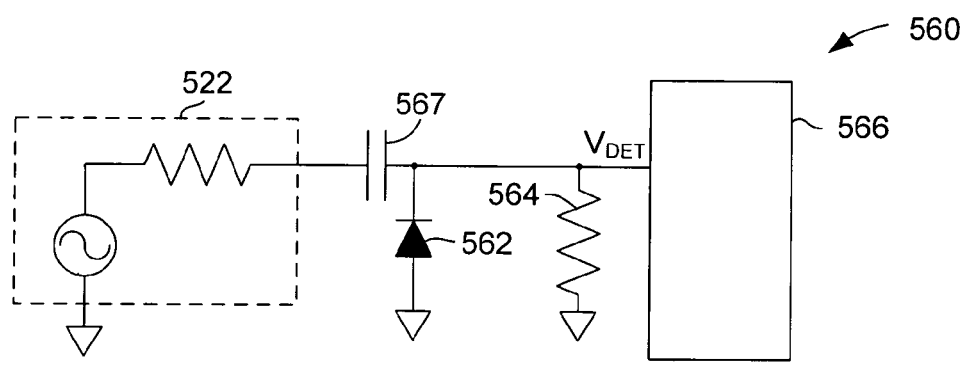
FIG. 5D is a circuit diagram of a single-diode detector in a shunt configuration used in an embodiment.

FIG. 5D is a circuit diagram of a single-diode detector 560 in a shunt configuration used in an embodiment. The diode 562 works in cooperation with a series capacitor 567 and a shunt resistor 564 to provide a detected voltage $V_{DET}$ to the IF amplifier 566 according to an embodiment.

Figure 6A:
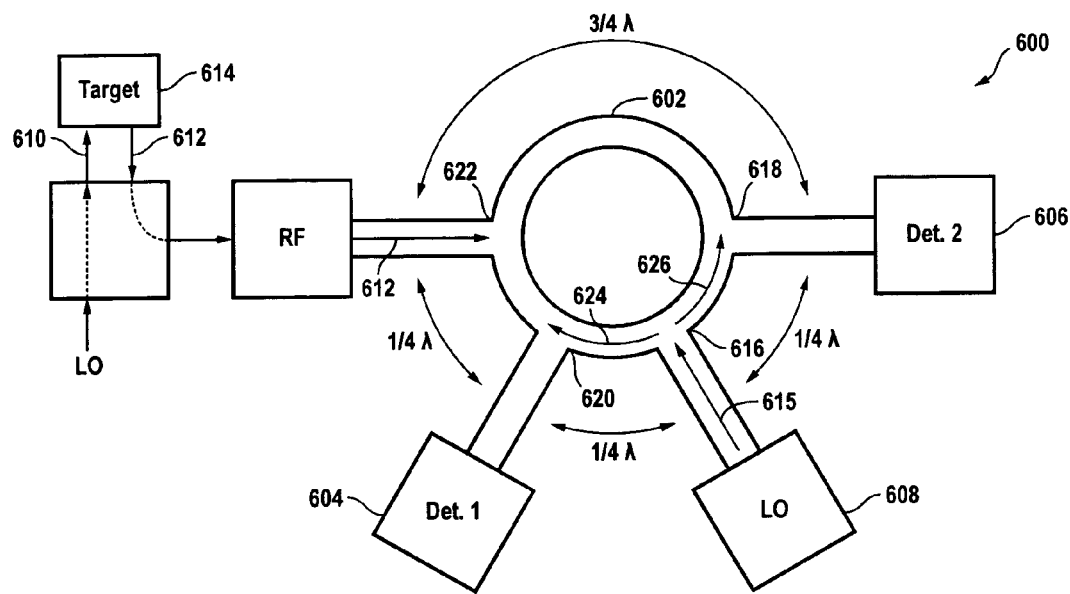
FIG. 6A is a plan view of a noise-canceling down-converting detector RF coupler for use in a field disturbance sensing system according to an embodiment.

FIG. 6A is a plan view of a noise-canceling down-converting detector RF coupler 600 for use in a field disturbance sensing system according to an embodiment. The RF coupler is fabricated as a transmission line having a selected characteristic impedance (e.g., 50 Ohms, 75 Ohms, or 300 Ohms). The widths of the conductive traces are selected in accordance with the thickness of the substrate (typically to a ground plane when a micro-strip transmission line is utilized) and with the dielectric constant of the substrate material and other characteristics to obtain the desired characteristic impedance, as is well known in the art of RF circuits. For purposes of convenient discussion, the "length" of an RF structure, such as a segment of the ring coupler 602, will be referred to in terms of the wavelength in which the system operates. In a particular embodiment, micro-strip transmission lines are fabricated on a dielectric substrate having relatively low dielectric loss (generally less than about 0.003 loss tangent at 10 GHz) and high dielectric constant (generally greater than about 2 at 10 GHz) such as a DUROID™ substrate, RODGERS RT™ 4350 or 4003 substrate available from ROGERS CORPORATION of Rogers, Conn., or ARLON-MED™ 25N, 25FR or AD350A substrate, available from ARLON-MED of Rancho Cucamonga, Calif., or TACONIC TLX™ or RF-35A™ substrate available from TACONIC of Petersburgh, N.Y., or ISOLA IS640™ available from ISOLA GROUP S.A.R.L. of Chandler, Ariz., which are poly(tetrafluoroethylene) ("TEFLON")-based circuit boards with metal-foil traces. Micro-strip high-frequency transmission structures generally have a trace of a selected width separated from a conductive ground plane (typically, but not always, on the opposite side of the substrate) by a known distance. Co-planar waveguide, stripline, single-sided stripline or co-axial transmission lines are used in alternative embodiments, or high-frequency transmission line types are mixed, such as using a micro-strip structure for one part of the system and co-planar wave guide for another. Alternative embodiments use an epoxy-fiberglass substrate, such as an FR-4 or G-10 substrate, other polymer-fiber substrate, a ceramic (e.g., alumina or polysilicon) substrate or single-crystal (e.g., sapphire or silicon) substrate.

The noise-canceling down-converting detector RF coupler 600 uses a ring hybrid coupler 602 and two diode detectors 604, 606. The diode detectors 604, 606 may be single or multiple diode detectors. The noise-canceling down-converting detector 600 is particularly desirable for coherent self-demodulated radar where the LO signal and the transmitted radar signal 610 are at the same frequency with a constant phase difference. The RF signal 612 is the portion of the transmitted (LO) signal 610 that is reflected by the target 614 with a frequency shift (i.e., Doppler shift) due to the target's velocity towards or away from the transmitted signal source (transmitted signal 610). Thus the RF signal 612 is shifted by only a small amount from the LO frequency (compared with the coupler bandwidth) and will have nearly the same wavelength as that transmitted signal and thus similar phase shift, and the system can be designed for a known frequency, which is generally the transmitted frequency, which in a particular embodiment is in one or more of the L-, S-, C-, X-, K-, Ku-, Ka-Band or other frequency. The details of the radar transmitting and receiving antennas are not shown in FIG. 6A, but they may be implemented either with a common antenna and an LO and RF combining network or be implemented with separate antennas for the LO and RF signals. The transmitted 610 and reflected 612 are routed through an antenna coupler (see, e.g., FIG. 7A, ref. num. 708, FIG. 7B, ref. num. 757), which routes the reflected (RF) signal to the noise-canceling down-converting detector RF coupler 600.

The ring hybrid coupler 602 has four ports 616, 618, 620, 622. The ring hybrid coupler 602 splits the LO signal 615 arriving at the LO port 616 into two equal signals 624, 626 and sends those LO signals to two detector ports 618, 620 that are essentially identical. The LO signals travel one quarter or an odd multiple of one quarter wavelengths of the LO signal from the LO port to either diode port (clockwise to diode port 620 and counterclockwise to diode port 618). The RF port 622 is located on the ring hybrid coupler 602 a distance of an even multiple of one half wavelength clockwise from the LO port 616 and an odd multiple of one half wavelength of the RF signal in the counter-clockwise direction around the ring hybrid coupler 602.

The LO signals 624, 626 cancel at the RF port 622, as the minimum signal path for 624 is ½λ (180 degrees), while the minimum signal path for 626 is λ (360 degrees), thus the LO signals 624 and 626 arrive 180 degrees out of phase. Alternative embodiments use other multiples of wavelengths. In an embodiment, the RF port 622 sits on the ring hybrid coupler 602 separated from one detector 604 by one quarter wavelength in the counter-clockwise direction and 5/4λ in the clockwise direction, and separated from the second detector 606 by three quarters of a wavelength in either direction. Thus the RF signal arrives at each detector in phase from either direction around the ring. The closest distance between the two detector ports, 618,620 is ½λ. Thus, the signal from the RF port 622 splits and arrives at the two detectors 604, 606 with a one-hundred and eighty degree phase difference. The same phase relationship can also be accomplished by scaling the ring by odd multiples of ¼λ.

The RF signal 612 and LO signal 615 are not at exactly the same frequency, but are separated by a very low frequency due to the Doppler shift of the moving target of the radar. This can be visualized as a large LO signal adding with a smaller RF signal which appears nearly identical in frequency to the LO signal, but that moves slowly in phase over time. For some cycles of the waveform, the RF and LO signals as seen by either of the detectors add in phase and increase the total amplitude of the waveform. One half-cycle of the difference frequency later, the RF and LO will add out of phase and decrease the total amplitude of the waveform seen by that detector. This results in a low frequency output (i.e., baseband, or "audio") from the diode detector at the difference frequency between RF and LO (either LO−RF or RF−LO), which is the frequency that results from the change of the phase in the path from the transmitted signal to the moving target and back. This constant change in phase (for a constant relative velocity of the target) is indistinguishable from a change in frequency and is understood as the Doppler Effect.

The two detectors. 604, 606 see the same phase of the signal from the LO port, but the small signal from the RF port adds to the amplitude of the LO signal at the first detector while it subtracts from the amplitude of the LO signal at the second detector. One half cycle of the difference frequency later, the phase of the RF signal has changed by 180 degrees versus the LO signal, and the first detector which saw an addition of the RF magnitude and the LO magnitude will now see a subtraction of the RF magnitude from the LO magnitude. Thus if one detector sees a higher output, the other detector will see a lower output due to the same RF signal. Coherent AM or AM noise of the LO signal will also show up as an addition or subtraction of the signals at each detector which will add or subtract at each detector identically (i.e., in phase) such that the algebraic combination of both detectors will see an increase in detected RF output level, while detected LO AM noise at that combined output is canceled.

An algebraic combining network (see FIG. 2A, ref. num. 218) takes the difference between the two detector outputs and provides an IF signal. Thus, the AM noise of the LO signal is canceled, while the detected amplitude of the RF signal shows up as the combination (sum) of the two detected RF signals. The differential IF amplifier takes the difference between the detected RF amplitudes, which are nominally 180 degrees out of phase. This corresponds to adding another 180 degrees of phase to one of the detected outputs and summing them, and is equivalent to adding the magnitudes of the two detected RF signals, since a subtraction of a negative value is equivalent to addition of the magnitude of that value.

The differential detector and differential IF amplifier work together to deliver high sensitivity to the received RF signal while canceling the AM noise on the LO signal, which would otherwise limit the sensitivity of the downconverter. In a further embodiment, the differential IF amplifier provides adjustment of the amplitude of one IF signal compared to the other IF signal (see, e.g., FIG. 3B, ref. num. 336) to further improve noise-canceling performance of the system, particularly when used in conjunction with a noise calibration technique in accordance with an embodiment.

Some embodiments include noise calibration to correct for variations in the detector gain and differences in signal path loss. Correct design of the RF transmission circuit and appropriate process control (repeatability) insures that the phase between LO signal portions and the RF signal portions remain balanced. Even if the RF path has some imbalance, sufficient LO AM noise is canceled to result in only a slight modification in the gain of the RF signals, while providing a large increase in the received signal to noise ratio.

The detectors 604, 606 do not operate like the diode switches used in typical mixers. The detectors 604, 606 can detect the input signal voltage with higher gain (voltage output for voltage input) if they are narrow bandwidth diode detectors, compared to the much wider bandwidth diode switches used in switching mixer circuits. Narrow-bandwidth diode detectors are easier to match than wider bandwidth diode switches, providing improved detection efficiencies and improved signal-to-noise ratio.

In an alternative embodiment, the RF port is connected to the coupler such that the two detectors see the RF signal portions arrive in phase with each other, but see the LO signal portions arrive 180 degrees out of phase with each other. The ring coupler geometry creates a differential structure that cancels the AM noise on the LO signal. The algebraic combining network still subtracts the two detector outputs in order to cancel the two detected LO AM noise portions, since the low frequency variation in AM noise will show up in phase at the two diode outputs regardless of the relative phase of the LO signals. Since the RF signals add to both detectors, but the LO signals on those detectors are 180 degrees out of phase with each other, the combination of LO and RF signals create a low frequency variation on the output of the detectors that is 180 degrees out of phase and at the frequency difference between the LO and RF signals. The algebraic combining network effectively adds the amplitudes of the two detected RF signal portions. This implementation may still require amplitude adjustment of one of the detector outputs to obtain the maximum cancelation of the LO AM signals or noise. Embodiments can incorporate single-diode or multiple-diode detectors or use alternative detector methods.

Figure 7A:
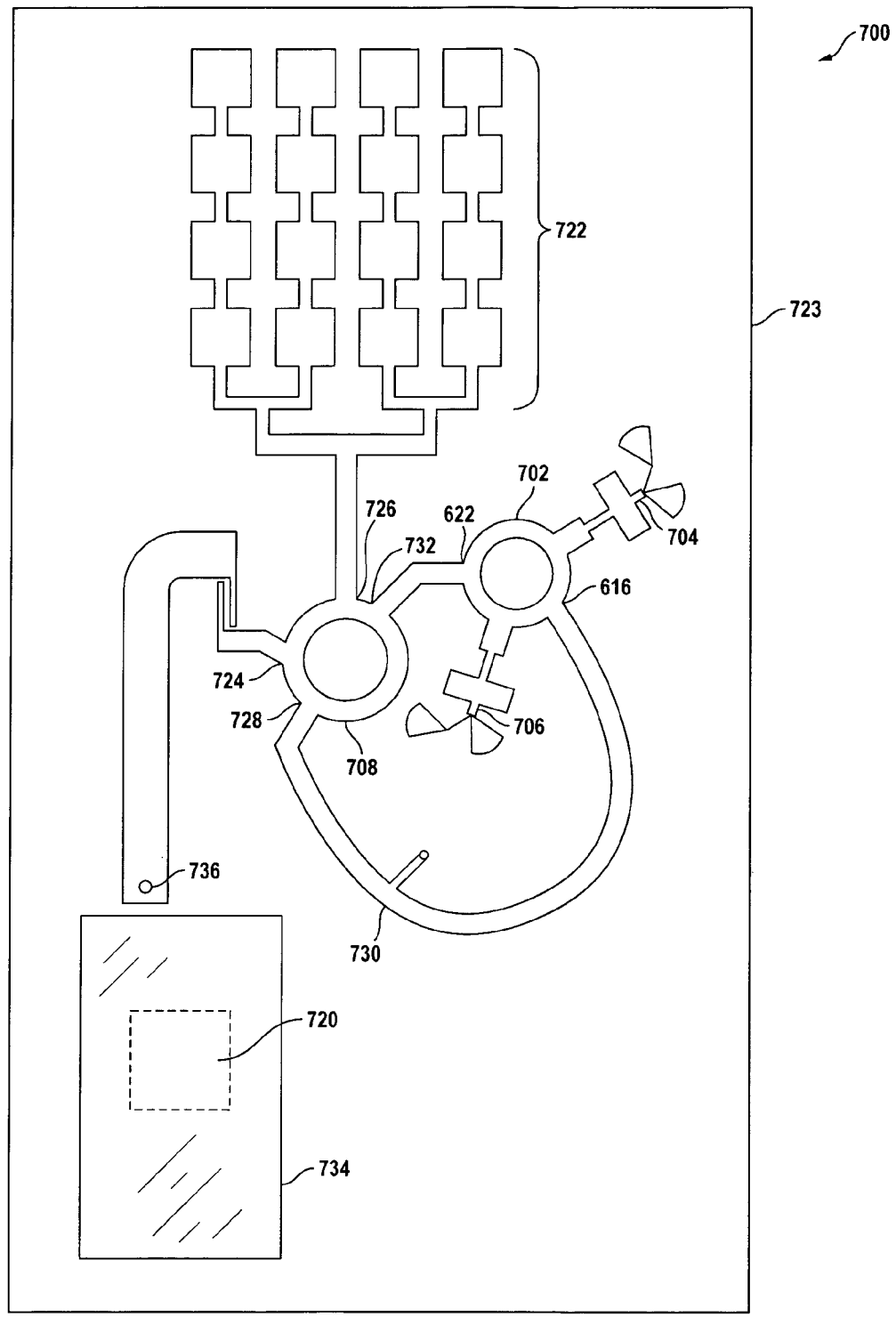
FIG. 7A is a plan view of a circuit board of a CW radar system according to an embodiment.
Figure 7B:
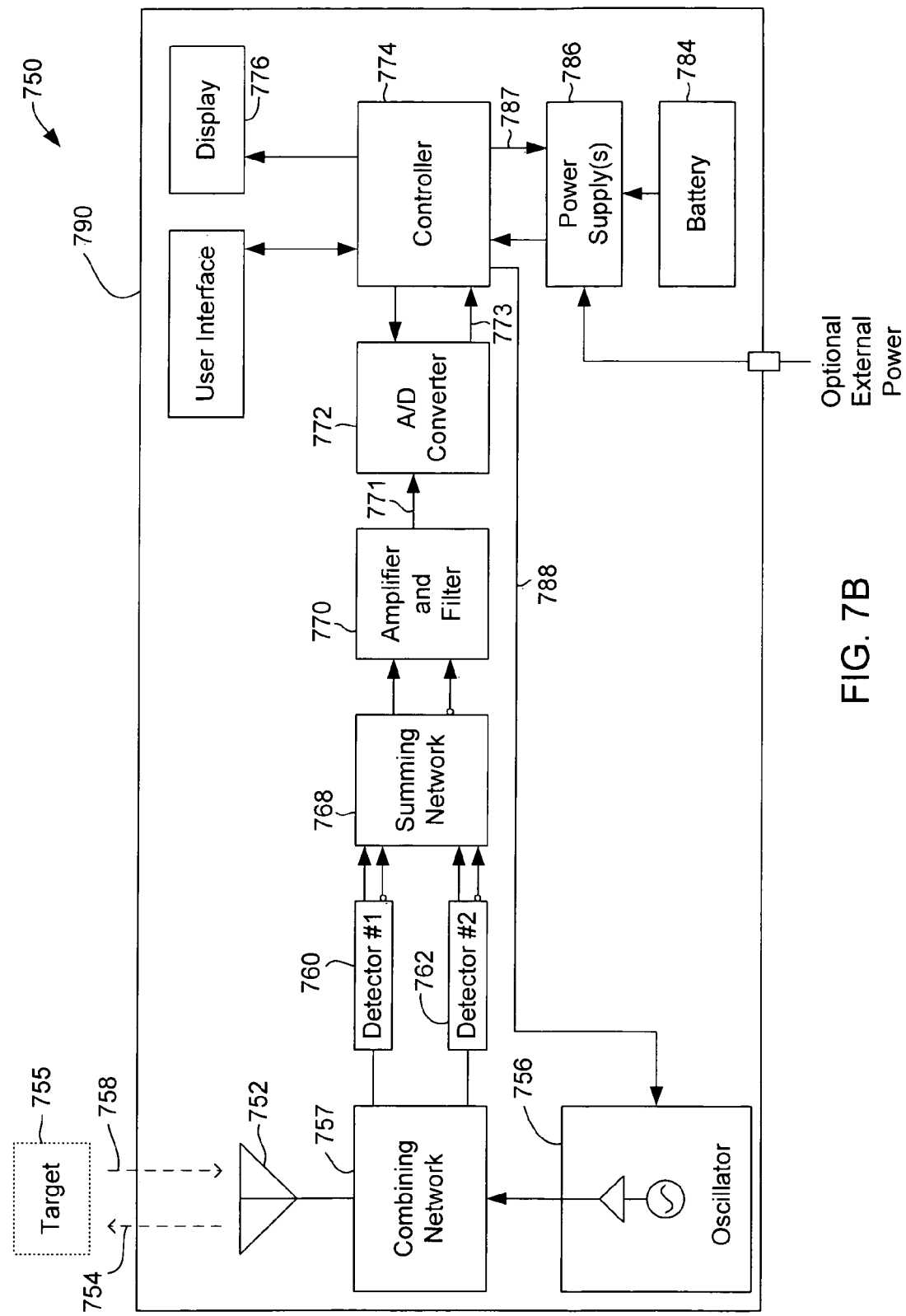
FIG. 7B is a diagram of a field disturbance measuring system according to an embodiment.

The detector outputs are coupled to a summing network (not shown, see FIG. 7B, ref. num. 768). The first stage of the summing network is an IF amplifier that receives the detector outputs from the detectors 604, 606 of FIG. 6A. This amplifier is a differential amplifier formed from an emitter coupled transistor pair. The gain may be changed by changing the bias current of the two transistors forming the differential amplifier. The outputs of the first stage of the IF amplifier for one detector are connected to a summing amplifier (e.g., an op amp), the positive output coupled to the input of an amplifier generating non-inverting gain and the negative output coupled to the input of an amplifier generating inverting gain. Because this network takes the difference between the two detectors, the outputs of the first stage of the second detector are coupled to the opposite polarity of the amplifier inputs, i.e., the positive output of the second detector runs to a port generating inverting gain, and the negative output of the second detector runs to a port generating non-inverting gain. This configuration generates a difference between the two detector outputs and cancels common mode noise variations in the supply or gain control voltages for the first stages of the IF amplifier. The differential character of the differential noise canceling detector preserves noise cancelation at all elements of the receiver chain up to the amplifier output. In a further embodiment, the amplifier is replaced by a differential amplifier with differential outputs, which further reduces sensitivity to common mode interference.

Figure 6B:
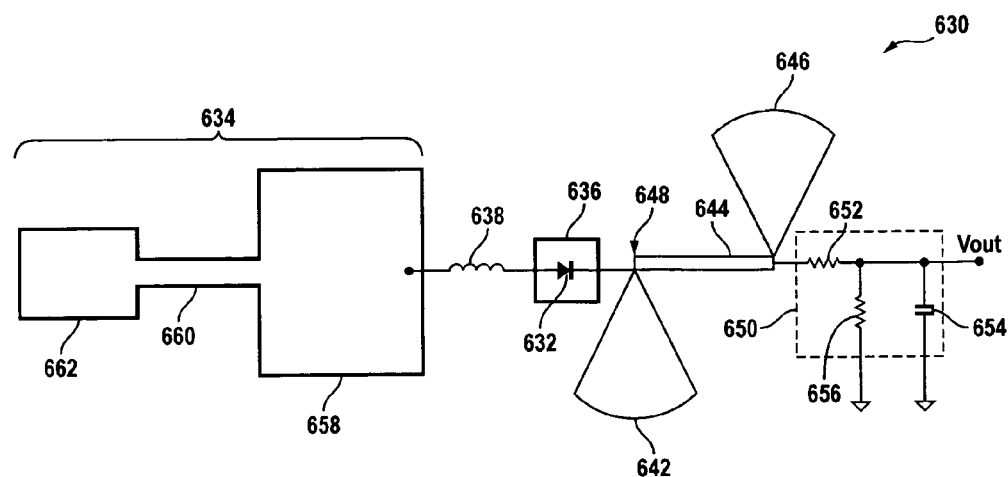
FIG. 6B is a plan view of a single-diode detector circuit according to an embodiment.

FIG. 6B is a plan view of a single-diode detector circuit 630 according to an embodiment. The detector circuit is used as the first or second detector 604, 606 of FIG. 6A, for example. A diode 632 is matched to the transmission line impedance of the ring coupler (see, e.g., FIG. 6A, ref. num. 602) with a matching structure 634. The diode 632 is a diode chip that is that is mounted on a pad 636 of conductive foil defined on the surface of the circuit substrate, and is connected to the matching structure 634 with a bond wire or other suitable connector 638, which is represented as an inductor. Packaged diodes are used in alternative embodiments.

The diode uses a DC path to develop a current and provide a detected output ($V_{OUT}$) from the incident high-frequency power (i.e., LO and RF signals). A network with fan lines 642, 646 on opposite ends of a high-impedance transmission line 644 provides both a high impedance at the LO frequency and a DC path for diode current, as is well known in the art of high-frequency hybrid microcircuit design. Any of several matching and bias structures are suitable in various embodiments, and some embodiments may utilize different matching and biasing techniques on different detector circuits. Accordingly, the detector circuit 630 is merely exemplary. Alternative embodiments use detector circuits with one or more diodes in a shunt configuration. It is generally desirable to provide a DC connection to the output of the diode without loading the resonance of the diode inductance and fan line 642 capacitance. Many mixer circuits operate in a relatively low characteristic impedance system, such as a 50-ohm system. Detectors in some embodiments operate in circuits with much higher impedance, which avoids loading the resonance and delivers higher voltage gain from the detector.

A second fan line 646 connects to a network 650 that has a series resistor 652, shunt capacitor 654 and a shunt resistor 656. The series resistor 652 should have a resistance large enough to provide isolation between the fan 646 and the following shunt capacitor 654, yet have a resistance sufficiently lower than the shunt resistor 656 to ground, so as not to unduly attenuate the output voltage $V_{OUT}$. For example, with a shunt resistor 656 in the range of 1 to 5 K ohms, the series resistor 652 is between about 20 ohms and about 200 ohms.

The shut capacitor 654 is chosen to have a self-resonant frequency above the highest expected IF frequency, and below the LO frequency. In a particular, embodiment with an LO frequency of about 24 GHz, the shunt capacitor is chosen to have a self-resonant frequency not greater than about two GHz. This provides some immunity from adjacent signal sources, such as other radar units or communications devices, from affecting the output voltage $V_{OUT}$. The shunt capacitor 654 and shunt resistor 656 in conjunction with the resistance and capacitance presented by the following amplifier connected to Vout will determine the IF bandwidth, which must be set large enough to enable reception of the highest frequency IF signal expected to be received. The shortened fan lines 642, 646 and series inductances of the diode and package, line 644, and other leads, provide attenuation at LO and RF frequencies. Several other networks are alternatively used, as would be appreciated by one of skill in the art.

Transmission lines 658, 660, 662 are used in the matching structure 634 to match the impedance of the diode/fan line resonance to the system impedance of the ring coupler. Other transmission line matching structures are alternatively used. For example, an alternative design uses a single one quarter wavelength long transmission line with impedance equal to the geometric mean of the source and load impedances. In an alternative embodiment, discrete components are used in a matching circuit.

Figure 6C:
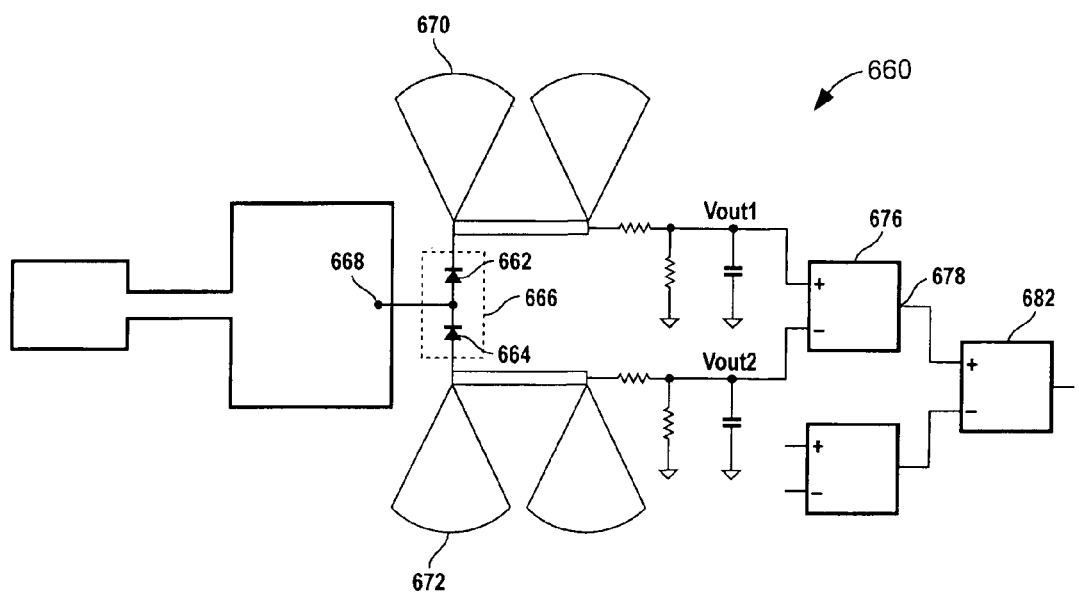
FIG. 6C is a plan view of a dual-diode detector circuit 660 according to an embodiment.

FIG. 6C is a plan view of a dual-diode detector circuit 660 according to an embodiment. Two diodes 662, 664 are connected in series. In a particular embodiment, the diodes are made in a single package 666 to reduce stray capacitance and inductance, and the package of two diodes is referred to as a dual diode. Some embodiments use stacked diodes. The common junction 668 of the two diodes connects through a wide/narrow matching structure (see, e.g., FIG. 6B, ref. num. 634) to the detector input port (e.g., FIG. 6B, ref. num. 618 or 620), as discussed above in reference to FIG. 6B. The other terminals of the dual diodes are each connect to a shortened fan line 670, 672 emulating a capacitance to tune out the diode and package lead inductances and resonate at the LO frequency. Each diode and shortened fan line junction connects to a circuit presenting a high impedance load at the LO frequency, but connects to the diode at DC to provide a detector output and a DC current path. This circuit may take the form of the narrow line and fan line plus series resistor and shunt resistor and capacitor as described above in reference to FIG. 6B. An alternative embodiment takes the form of a high impedance network at the LO frequency such as an RF choke, which provides a high impedance. One diode of the dual diode package detects the positive peaks of the detector input signal and the other diode of the dual diode package detects the negative peaks of the detector input signal (see, e.g., FIG. 5B and associated description).

The outputs $V_{OUT1}$, $V_{OUT2}$ of the two diodes are connected to the inputs of a differential amplifier 676. The output 678 of the differential amplifier 676 is connected to the input of a differential IF amplifier 682. The dual diode detector circuit 660 operates similarly to the single diode detector circuit of FIG. 6B, but typically delivers significantly higher output voltage than a single diode detector, depending upon the losses in the matching networks and stray capacitances and inductances.

FIG. 7A is a diagram of a portion of a CW radar system 700 according to an embodiment. A first ring coupler 708 routes the LO signal from a local oscillator 720 to an antenna 722 and routes the RF signal from an antenna 722, which in a particular embodiment is a patch antenna fabricated on the same substrate 723 as the ring couplers 702, 708. The substrate 723 is commonly known as a "printed circuit board". A single antenna 722 is used in the CW radar system 700 to both transmit the LO signal (see, FIG. 6A, ref. num. 610) and to receive the reflected RF signal. Alternative embodiments use two antennas, one for transmitting and one for receiving allowing for additional receiver gain for better sensitivity and range. The gain increases because the received signal at the antenna may connect directly to the NCDD input as opposed to an antenna coupler, which typically introduces about 3 dB of loss. The antenna is designed to operate at the LO frequency, which in a particular embodiment is about 24 GHz. The RF and LO are essentially the same frequency in a CW Doppler radar system. A second ring coupler 702 is configured substantially as described above in reference to FIG. 6A, and includes two detectors 704, 706 substantially as described above in reference to FIG. 6B. Alternatively, multiple-diode detectors are used for one or both of the detectors 704, 706.

Each ring is optimized to maintain to best performance of the overall system. In a particular embodiment, the local oscillator 720 is a dielectric resonator oscillator ("DRO", also known as dielectric resonator stabilized oscillators ("DSOs")). DROs are low-cost, compact, and consume relatively little power consumption; however, DROs often have too much AM noise to be used in conventional diode detector CW radar systems without noise cancelling. Embodiments of the invention canceling LO AM noise allow DROs to be used in many different radar applications, including radar applications requiring low power consumption, long range, or measurement accuracy. Alternative embodiments use a transmission line resonator oscillator or other oscillator.

The first ring coupler 708 receives the LO signal at a first port ("LO input port") 724 and distributes the LO signal to an antenna port 726 for transmission to the target (not shown) and an LO port 728. The portion of the LO signal coupled to the LO port 728 is transmitted through a transmission line 730 to deliver the LO signal to the LO port 616 ("of the second ring coupler 702. The portion of the LO/RF signal coupled to the RF port 732, which is directly across from the LO port 728 and isolated from LO signal is coupled to the RF port 622 of the first ring coupler 702. Other details of the radar system 700 are well known in the art of RF circuit design and are omitted for clarity of illustration.

The LO input port 724 is separated from the LO output port 728 by ¼λ, from the antenna port 726 by ¼λ and from the RF output port 732 by ½λ CW and 1λ CCW for a difference of 180 degrees. This allows the LO signal to split into 2 paths, to the antenna and to the differential detector. The second ring hybrid coupler sends the LO signal to the two detector diodes nominally in phase and the RF input signal from the antenna nominally 180 degrees out of phase at the two diode detectors. In a particular embodiment, the LO 720 is fabricated on the opposite side ("second side") of the substrate 723 from the side ("first side") of the substrate that the ring couplers 702, 708 and antenna 722 are fabricated on. A ground plane 734 on the first side overlies the LO circuit on the second side (not shown), and the LO signal is brought from the second side, where it is generated, to the first side through a plated via 736. A ground plane on the second side (not shown) underlies the antenna 722 and generally the RF circuitry on the first side, as is known in the art of RF microstrip design.

FIG. 7B is a diagram of a field disturbance measuring system 750 according to an embodiment. In a particular embodiment, the system 750 is an integrated CW radar system. The system 750 includes an antenna 752 that transmits a signal (LO signal) 754 generated by an oscillator circuit 756 at a target 755. The target 755 is shown in dashed lines because the target is not part of the system. The system measures the speed at which the target is moving relative to the system, if any. The target may be stationary while the system is moving, the target may be moving while the system is stationary, or both target and system may be simultaneously moving relative to the general landscape or other reference frame.

The antenna 752 and receives a signal (RF signal) 758 reflected off the target 755. The reflected signal is combined with the LO signal in a combining network 757 (see, e.g., FIGS. 1-2B and associated Written Description) and provided to a first detector 760 and to a second detector 762 that operate as differential detectors to cancel AM noise (see, e.g., FIGS. 3A-4B and associated Written Description). In an alternative embodiment, a first antenna is used to transmit the LO signal and a second antenna is used to receive the reflected signal. An amplifier (preamplifier) is optionally placed after the antenna in the reflected signal path.

The outputs of the first and second detectors 760, 762 are provided to an algebraic summing network 768. Differential outputs of the summing network 768 are coupled to an amplifier and filter 770, which convert the differential inputs to a single-ended signal 771. An analog-to-digital converter 772 converts the signal, representing the detected voltage, into a digital value 773 that is processed by a controller 774, which renders the measured speed (between the target and system) to an electronic display screen 776, such as a liquid crystal display screen. The system 750 optionally includes a user interface 778 for communicating information such as the measured speed to an external device, accepting a trigger to start the radar speed measurement process, modifying the function of the radar to report the speed in alternative units or optimizing the radar speed measurement process to report the speed of a particular type of object (i.e. optimized for measuring a vehicle or a baseball) or report the measured speed within a particular limit of high and low speeds. In an alternative embodiment, a system does not include an integrated display, and the controller provides relative speed data to a device (not shown) outside of the system.

In a particular embodiment, the system 750 is a portable system powered by a battery(s) 784. In a further embodiment, the portable system is intended to be operated as a hand-held system. In an alternative embodiment, the battery is not included in the system, and power is supplied from an external source, such as an external battery (e.g., a vehicle battery) or mains power (e.g. from a transformer connected to the mains power). A power supply circuit 786 provides voltage regulation and similar functions to generate the appropriate voltages and supply currents to power the system components. Individual power lines to each powered component are omitted for simplicity and clarity of illustration. In a particular embodiment, operation of the power supplies are monitored by the controller 774 and A/D converter 772, and adjusted or turned off and on, if necessary, through a power supply control line or lines 787.

The controller 774 provides an amplitude modulation control signal 788 to the oscillator circuit 756, which creates amplitude modulation of the oscillator 756 to enable calibration of the NCDD to minimize the detected level of AM noise of the oscillator 756 by the NCDD. In a particular embodiment, the controller 774 includes memory, such as calibration tables, or the system 750 includes separate memory (not shown) that cooperates with the controller. In a particular embodiment, the controller 774 includes a signal processing block and an optional automatic calibration block that works in cooperation with an AM signal generator (i.e., a signal on the AM control line 788 that modulates the oscillator 756 in a known fashion). In a particular embodiment, the system is integrated in a housing 790 containing the other system elements for hand-held application. In a particular embodiment, the housing 790 is a rectangular plastic housing having approximate dimensions of 2.25 inches by 4.5 inches by one inch. Alternative systems are provided as original-equipment manufacturer ("OEM") systems, and incorporated into other products wherein the housing may be omitted.

Figure 8A:
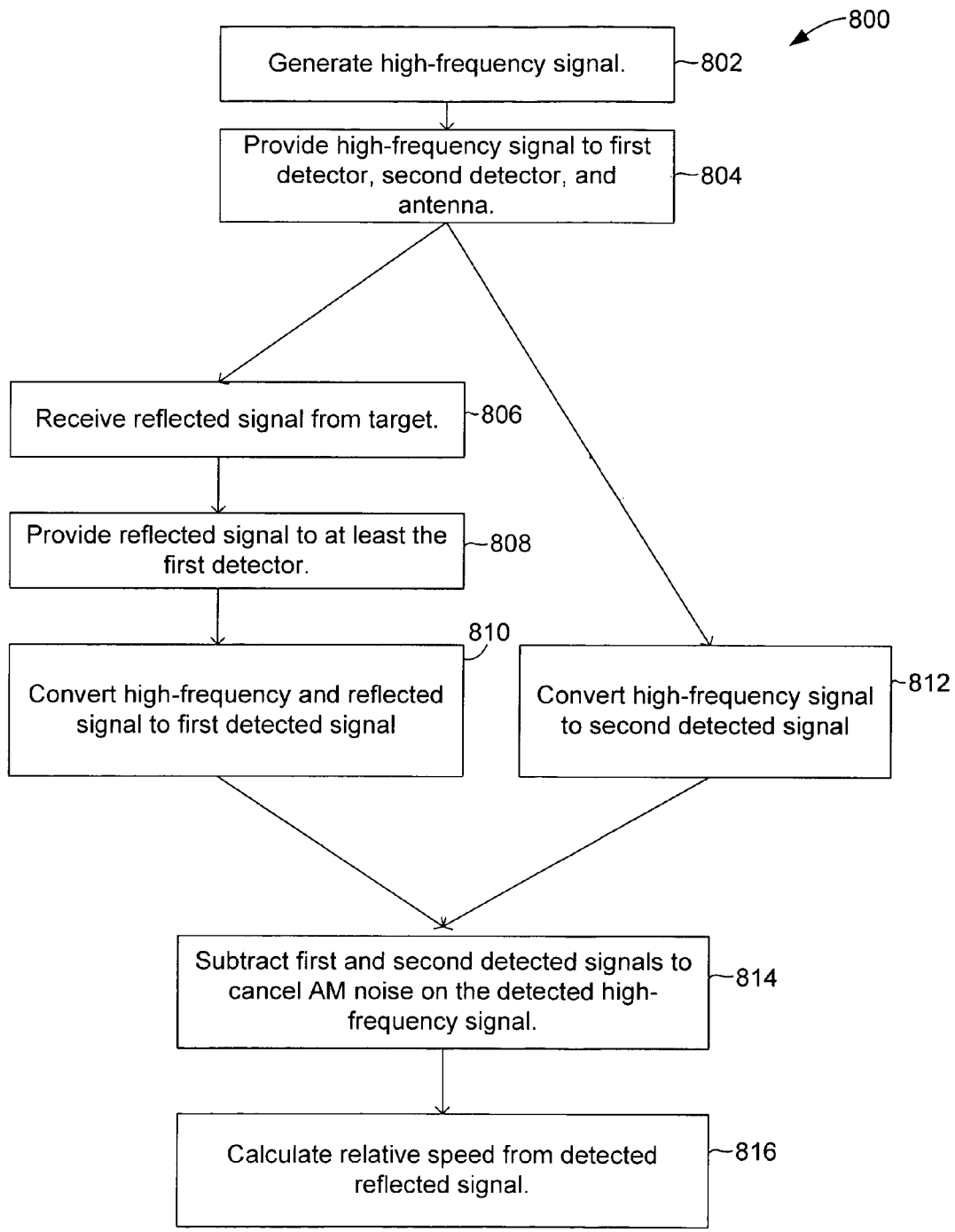
FIG. 8A is flow chart of a method of down-converting according to an embodiment.

FIG. 8A is flow chart of a method of down-converting 800 according to an embodiment. A high-frequency signal (e.g., the LO signal) is generated (step 802). The high-frequency signal is provided to an antenna, a first detector and a second detector (step 804). The antenna receives a reflected signal (e.g., the RF signal) from a target (step 806), and the reflected signal is provided to at least the first detector (step 808). The first detector converts the reflected signal and high-frequency signal to a first detected output (step 810), and the second detector concurrently converts at least the high-frequency signal to a second detected output (step 812). The first and second detected outputs are algebraically combined (e.g., subtracted from each other) so as to cancel the detected high-frequency signals, including AM noise on the detected high-frequency signals (step 814). The LO AM noise is correlated between the detectors and their outputs will increase for higher LO power or decrease for lower LO power on both detectors, regardless of the phasing of the LO signals sent to the detectors, thus detector output algebraic combiners will subtract one detector output from the other output. Embodiments of the method of FIG. 8A are used in motion sensing systems, such as door openers, distance ranging systems, automotive speed or range sensors or low IF receivers. In a particular embodiment, the combined detected reflected signal is processed to derive a relative speed between the radar system and the moving target (step 816).

In a particular embodiment, the second detector detects the same phase of the RF signal as the first detector, and the opposite phase (i.e., 180 degrees out of phase) of the LO signal. One of the detected RF signals is inverted at the detector output and subtracted from the other detected RF signal, while the detected LO AM signals cancel due to the same subtraction. In an alternative embodiment, the second detector detects the opposite phase of the RF signal as the first detector, and the same phase of the LO AM signal. The output of one of the detector outputs is subtracted from the other to add the detected (downconverted) out of phase RF signals and cancel the detected in phase (demodulated) LO AM signals. In both cases the demodulated amplitude modulation of the LO signals comes out of the detectors in phase at the detector outputs and the downconverted RF signal comes out of the detectors out of phase at the detector outputs.

Figure 8B:
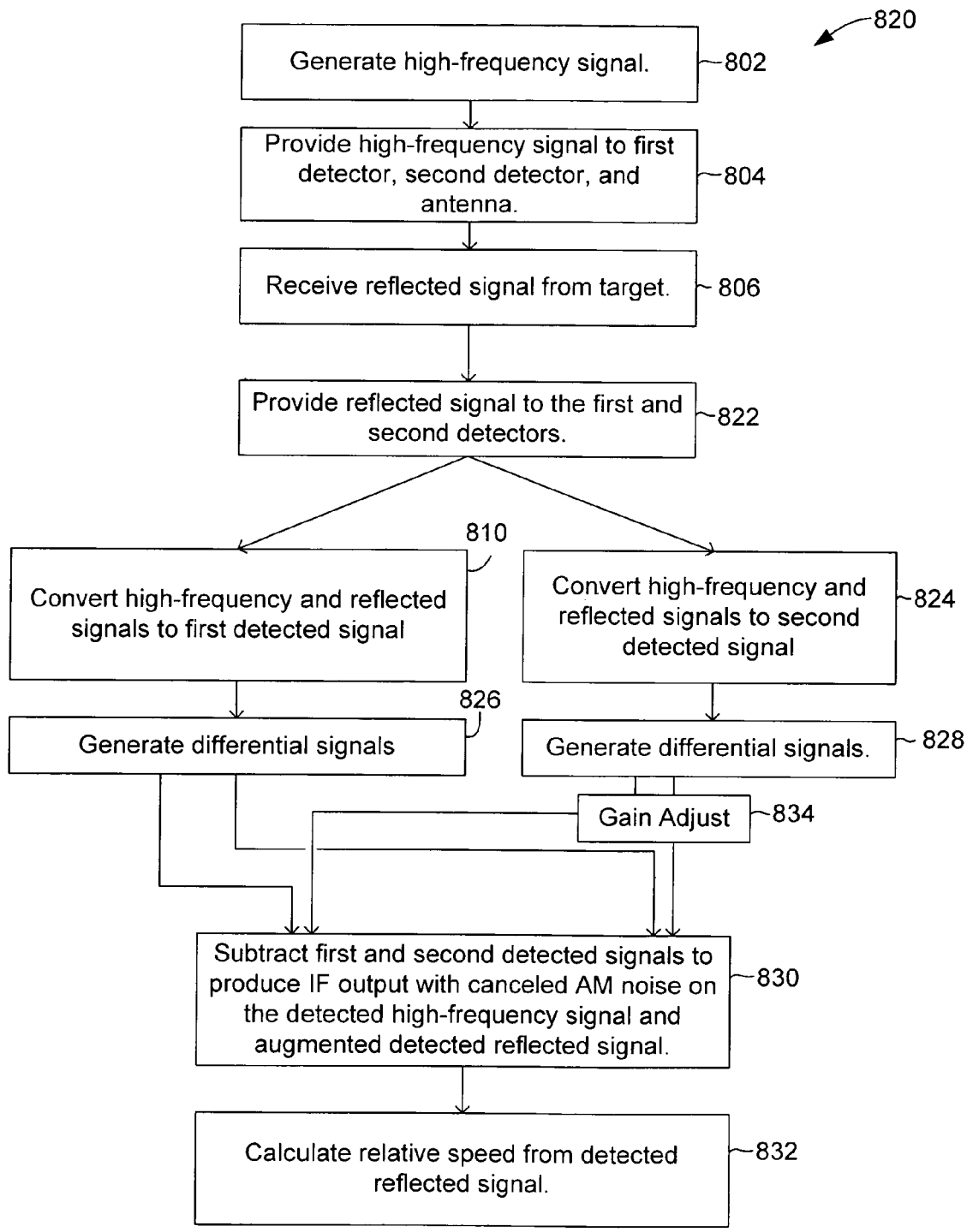
FIG. 8B is a flow chart of a method of sensing an electromagnetic field disturbance according to an embodiment.

FIG. 8B is a flow chart of a method of sensing an electromagnetic field disturbance 820 according to an embodiment.

A high-frequency signal (e.g., the LO signal) is generated (step 802). The high-frequency signal is provided to an antenna, a first detector and a second detector (step 804). The antenna receives a reflected signal (e.g., the RF signal) from a target (step 806). A reflected signal is provided to the first detector and an inverse reflected signal is provided to the second detector (step 822). The first detector converts the reflected signal and high-frequency signal to a first detected output (step 810), and the second detector concurrently converts the inverse reflected signal and high-frequency signal to a second detected output (step 824). In a particular embodiment, the first detected output is a detected LO signal and a detected RF signal, and the second detected output is essentially the first detected LO signal and a negative detected RF signal.

The first detected output is provided to a first algebraic combining network and the second detected output is concurrently provided to a second algebraic combining network (step 826). The first algebraic combining network produces a first differential signal and an inverse first differential signal and the second algebraic combining network produces a second differential signal and an inverse second differential signal (step 832). The first differential signal is provided to a positive input (i.e., non-inverting input) of a third algebraic combining network, the inverse first differential signal is provided to a negative input (i.e., inverting input) of the third algebraic combining network, the second differential signal is provided to a second negative input of the third algebraic combining network and the inverse second differential signal is provided to a second positive input of the third algebraic combining network. The third algebraic combining network produces an output (e.g., the IF output) (step 830). In a further embodiment, the combined detected reflected signal is processed to derive a relative speed between the radar system and the target (step 832).

In a further embodiment, gain (including negative gain, which is also known as attenuation) is applied to the output of the second algebraic combining network (step 834) to match the detected LO signal from the first detector to the detected LO signal from the second detector so as to cancel AM noise detected on the LO signals.

FIG. 9A is a flow chart of a method of calibrating noise 900 in a field disturbance sensing-system according to an embodiment. A high-frequency signal (e.g., the LO signal) is applied to an antenna, a first detector and a second detector of the field disturbance sensing system (step 902). The first and second detectors are arranged as noise canceling detectors (see, e.g, FIGS. 1-3B). The antenna is shielded so as to not receive reflections from moving objects or other external radiation (step 904). Shielding can be performed before or after the high-frequency signal is applied. Shielding can be performed in a variety of ways, such as pointing the antenna into an open box lined with radio frequency absorbing material or pointing the antenna towards an area with no target to create a reflection.

Gain adjustments are stepped through a selected range of settings (see, e.g., FIG. 3B, ref. no. 336) and the output level (e.g., IF level 338 or other suitable signal level), which indicates the differential noise, is recorded (step 906). The gain setting associated with the lowest detected AM noise level is identified (step 908), and then saved (step 910). During operation, the gain setting associated with the lowest detected AM noise level is applied, and a noise canceling field disturbance measurement is made (step 912).

Gain is adjusted in various ways in alternative embodiments. For example, an adjustable gain element is included in one of the detected signal paths to increase or decrease the gain of that detected signal relative to another detected signal. Alternatively, the bias of elements, such as the bias level to one or more transistors, is changed. As the gain in one of the detector paths changes, the level of noise will fall to a minimum value. By observing the noise level for each bias control step, one can identify the gain setting where the noise begins to increase as the bias control leaves that optimum area (e.g., increasing or decreasing bias control voltage above or below the bias control voltage at the minimum noise condition). In a particular embodiment, a threshold is defined at a selected excursion from the minimum point. The gain settings at which the noise equals the threshold is determined (i.e., the minimum noise will be between the two threshold settings, but may be relatively "flat", making a direct measurement of the minimum noise point less precise). The optimum point for best LO noise rejection is set by choosing the gain setting between the gain settings for the two thresholds identified above. In embodiments that use more than two detectors (see, e.g., FIG. 4), the gain of a combined detector signal (e.g., the output of network 402 or network 404) may be adjusted so as to achieve minimum AM noise.

FIG. 9B is a flow chart of a method of calibrating noise 920 in a field disturbance sensing system with an AM generator according to an embodiment. A high-frequency signal (e.g., the LO signal) is applied to an antenna, a first detector and a second detector of the field disturbance sensing system (step 922). The first and second detectors are arranged as noise canceling detectors (see, e.g, FIGS. 1-3B). The antenna is shielded so as to not receive reflections from moving objects or other external radiation (step 924). Shielding can be performed before or after the high-frequency signal is applied, and before or after the calibration signal is applied, as long as the shielding is in place before the measurement sequence begins.

A calibration signal that mimics AM noise of the LO, or a signal at an operating frequency (e.g., the LO frequency plus sidebands) is applied to a first detector and to a second detector of a noise-canceling down-converting detector system (see, e.g., FIGS. 1, 2A, 3B). In a particular embodiment, the LO is modulated with an AM signal generated by the system (see, e.g., FIG. 7B, ref. nums. 756, 788, 744) (step 926). Gain adjustments are stepped through a selected range of settings and the output level (e.g., IF level 338 or other suitable signal level), which indicates the differential noise, is recorded (step 928). The gain setting associated with the lowest detected AM signal (AM noise) level is identified (step 930), and the saved (step 932). During operation, the gain setting associated with the lowest detected AM signal output level is applied (step 934), and a noise canceling field disturbance measurement is made (step 936).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A detector system comprising:
   a first detector configured to detect a first high-frequency signal having amplitude-modulated ("AM") noise to produce a first detected signal having at least a first detected AM noise signal component and a demodulated signal component;
a second detector configured to detect a second high-frequency signal having the AM noise to produce a second detected signal having at least a second detected AM noise signal component; and
an algebraic combining network combining the first detected signal and the second detected signal to cancel the first detected AM noise signal component with the second detected AM noise signal component to produce an output signal including the demodulated signal component.

2. The detector system of claim 1 wherein the first high-frequency signal includes a local high-frequency signal and a received high-frequency signal, the demodulated signal component being at a difference frequency between the local high-frequency signal and the received high-frequency signal.

3. The detector system of claim 2 wherein the second high-frequency signal is the local high-frequency signal.

4. The detector system of claim 2 wherein the second high-frequency signal includes the local high-frequency signal and the received high-frequency signal, the second detected signal further including a second demodulated signal component at the difference frequency.

5. The detector system of claim 4 wherein the output signal of the algebraic combining network further includes the second demodulated signal component added to the demodulated signal component.

6. The detector system of claim 2 wherein the received high-frequency signal is a reflected signal of the local high-frequency signal.

7. The detector system of claim 1 further comprising a high-frequency algebraic combining network combining the local high-frequency signal and the received high-frequency signal and providing the local high-frequency signal and the received high-frequency signal to the first detector.

8. The detector system of claim 1 wherein the algebraic combining network has an inverting input and a non-inverting input, the first detected signal being provided to the non-inverting input and the second detected signal being provided to the inverting input.

9. The detector system of claim 1 wherein the first high-frequency signal includes a local high-frequency signal and a received high-frequency signal, the output signal being at a difference frequency.

10. The detector system of claim 1 further including a high-frequency algebraic combining network configured to receive a local high-frequency signal and a received high-frequency signal and to provide the local high-frequency signal and the received high-frequency signal to the first detector, and to provide the local high-frequency signal and an inverse of the received high-frequency signal to the second detector, the second detector producing the second detected signal having the second detected AM noise signal component and an inverse demodulated signal component.

11. The detector system of claim 10 wherein the algebraic combining network has an inverting input and a non-inverting input, the first detected signal being provided to the non-inverting input and the second detected signal being provided to the inverting input to produce an inverse AM noise signal component and a second demodulated signal component, the output signal being a sum of the demodulated signal component and the second demodulated signal component, the inverse AM noise signal component canceling the AM noise signal component.

12. The detector system of claim 1 wherein the first detector comprises a first single-diode detector and the second detector comprises a second single-diode detector.

13. The detector system of claim 1 wherein the first detector comprises a first dual-diode detector and the second detector comprises a second dual-diode detector.

14. The detector system of claim 1 wherein the first detector comprises a first diode voltage multiplier and the second detector comprises a second diode voltage multiplier.

15. The detector system of claim 10 wherein the high-frequency algebraic combining network comprises
a first received signal path through the high-frequency algebraic combining network,
a second received signal path through the high-frequency algebraic combining network,
a first LO signal path through the high-frequency algebraic combining network,
a second LO signal path through the high-frequency algebraic combining network,
a first high-frequency combiner combining a received signal in the first received signal path and an LO signal in the first LO signal path and providing a first combined signal to the first detector, and
a second high-frequency combiner combining the received signal in the second RF signal path and the LO signal in the second LO signal path and providing a second combined signal to the second detector.

16. The detector system of claim 15 wherein the first combined signal is the LO signal plus the received signal and the second combined signal is the LO signal minus the received signal.

17. The detector system of claim 1 further comprising a second algebraic combining network disposed between the first detector and the algebraic combining network having a first positive output connected to a first non-inverting input of the algebraic combining network, and a first negative output connected to a first inverting input of the algebraic combining network.

18. The detector system of claim 17 wherein the second detected signal further includes a second demodulated signal component, further comprising a third algebraic combining network disposed between the second detector and the algebraic combining network having a second positive output connected to a second inverting input of the algebraic combining network, and a second negative output connected to a second non-inverting input of the algebraic combining network.

19. The detector system of claim 18 further comprising an adjustable gain stage disposed between the algebraic combining network and one of the second algebraic combining network and the third algebraic combining network.

20. The detector system of claim 19 wherein the second detected AM noise signal component is equal to the first detected AM noise signal times a gain factor, the adjustable gain stage dividing the second detected AM noise signal component by the gain factor.

* * * * *